(12) United States Patent
Tinnemans et al.

(10) Patent No.: US 10,962,887 B2
(45) Date of Patent: *Mar. 30, 2021

(54) LITHOGRAPHIC METHOD

(71) Applicant: ASML NETHERLANDS B.V., Veldhoven (NL)

(72) Inventors: Patricius Aloysius Jacobus Tinnemans, Hapert (NL); Edo Maria Hulsebos, Waalre (NL); Henricus Johannes Lambertus Megens, Waalre (NL); Sudharshanan Raghunathan, Fremont, CA (US); Boris Menchtchikov, Redwood City, CA (US); Ahmet Koray Erdamar, Eindhoven (NL); Loek Johannes Petrus Verhees, Reusel (NL); Willem Seine Christian Roelofs, Deurne (NL); Wendy Johanna Martina Van De Ven, Heesch (NL); Hadi Yagubizade, Eindhoven (NL); Hakki Ergün Cekli, Singapore (SG); Ralph Brinkhof, Vught (NL); Tran Thanh Thuy Vu, Eindhoven (NL); Maikel Robert Goosen, Eindhoven (NL); Maaike Van't Westeinde, Veldhoven (NL); Weitian Kou, Eindhoven (NL); Manouk Rijpstra, Eindhoven (NL); Matthijs Cox, Valeknswaard (NL); Franciscus Godefridus Casper Bijnen, Valkenswaard (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 16/686,418

(22) Filed: Nov. 18, 2019

(65) Prior Publication Data
US 2020/0081356 A1 Mar. 12, 2020

Related U.S. Application Data

(63) Continuation of application No. 16/132,520, filed on Sep. 17, 2018, now Pat. No. 10,527,958.

(30) Foreign Application Priority Data

| Sep. 28, 2017 | (EP) | 17193637 |
| Mar. 28, 2018 | (EP) | 18164511 |
| Apr. 11, 2018 | (EP) | 18166720 |

(51) Int. Cl.
*G03F 7/20* (2006.01)
*G03F 9/00* (2006.01)

(52) U.S. Cl.
CPC .......... *G03F 7/70516* (2013.01); *G03F 7/705* (2013.01); *G03F 7/70258* (2013.01);
(Continued)

(58) Field of Classification Search
CPC .............. G03F 7/0663; G03F 7/70516; G03F 7/77011; G03F 7/70258
(Continued)

(56) References Cited

U.S. PATENT DOCUMENTS

| 8,245,161 B1 | 8/2012 | Tortonese et al. |
| 10,133,193 B2 | 11/2018 | Coskun et al. |

(Continued)

FOREIGN PATENT DOCUMENTS

| CN | 101082783 | 12/2007 |
| TW | 200710596 | 3/2007 |

(Continued)

OTHER PUBLICATIONS

Menchtchikov, Boris et al.: Reduction in overlay error from mark asymmetry using simulation, ORION, and alignment models, Proc. of SPIE, vol. 10587, Mar. 20, 2018.

(Continued)

*Primary Examiner* — Hung Nguyen
(74) *Attorney, Agent, or Firm* — Pillsbury Winthrop Shaw Pittman LLP

(57) ABSTRACT

A method for determining one or more optimized values of an operational parameter of a sensor system configured for measuring a property of a substrate is disclosed the method including: determining a quality parameter for a plurality of (Continued)

substrates; determining measurement parameters for the plurality of substrates obtained using the sensor system for a plurality of values of the operational parameter; comparing a substrate to substrate variation of the quality parameter and a substrate to substrate variation of a mapping of the measurement parameters; and determining the one or more optimized values of the operational parameter based on the comparing.

20 Claims, 12 Drawing Sheets

(52) U.S. Cl.
CPC ...... *G03F 7/70616* (2013.01); *G03F 7/70625* (2013.01); *G03F 7/70633* (2013.01); *G03F 7/70641* (2013.01); *G03F 9/7019* (2013.01); *G03F 9/7023* (2013.01); *G03F 9/7046* (2013.01); *G03F 9/7069* (2013.01); *G03F 9/7073* (2013.01)

(58) Field of Classification Search
USPC .............................................. 355/52, 53, 55
See application file for complete search history.

(56) References Cited

U.S. PATENT DOCUMENTS

| | | | |
|---|---|---|---|
| 10,527,958 B2* | 1/2020 | Tinnemans | ........... G03F 9/7023 |
| 2004/0174507 A1 | 9/2004 | Oishi | |
| 2005/0157296 A1 | 7/2005 | Hayano | |
| 2007/0021860 A1* | 1/2007 | Gertrudus Simons | ...................... G03F 7/70516 700/121 |
| 2007/0031745 A1 | 2/2007 | Ye et al. | |
| 2007/0279644 A1 | 12/2007 | Plug et al. | |
| 2009/0009741 A1 | 1/2009 | Okita et al. | |
| 2016/0223476 A1 | 8/2016 | Quintanilha | |
| 2016/0246185 A1 | 8/2016 | Ypma et al. | |
| 2017/0153558 A1 | 6/2017 | Tel et al. | |
| 2017/0206649 A1 | 7/2017 | Bozkurt et al. | |
| 2018/0348654 A1 | 12/2018 | Bijnen | |
| 2018/0373162 A1 | 12/2018 | Slotboom et al. | |

FOREIGN PATENT DOCUMENTS

| | | |
|---|---|---|
| TW | 201727391 | 8/2017 |
| TW | 201728991 | 8/2017 |
| WO | 2016162228 | 10/2016 |
| WO | 2016164372 | 10/2016 |
| WO | 2017009036 | 1/2017 |
| WO | 2017009166 | 1/2017 |
| WO | 2017032534 | 3/2017 |
| WO | 2017202602 | 11/2017 |
| WO | 2018095705 | 5/2018 |
| WO | 2019027744 | 2/2019 |
| WO | 2019048214 | 3/2019 |

OTHER PUBLICATIONS

Menchtchikov, Boris et al.: "Computational scanner wafer mark alignment", Proc. of SPIE, vol. 10147, Mar. 30, 2017.
Extended European Search Report issued in corresponding European Patent Application No. 19206439.2, dated Feb. 25, 2020.
Taiwanese Office Action issued in corresponding Taiwanese Patent Application No. 107133296, dated Jan. 16, 2020.
Taiwanese Office Action issued in corresponding Taiwanese Patent Application No. 107133296, dated May 14, 2019.
U.S. Office Action issued in corresponding U.S. Appl. No. 16/650,520, dated Nov. 23, 2020.

* cited by examiner

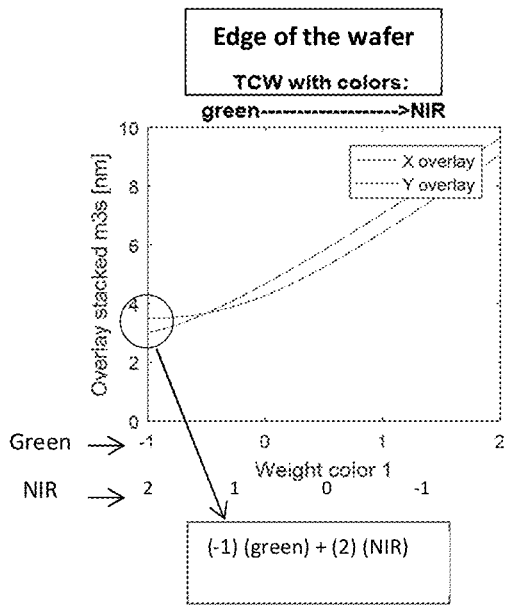 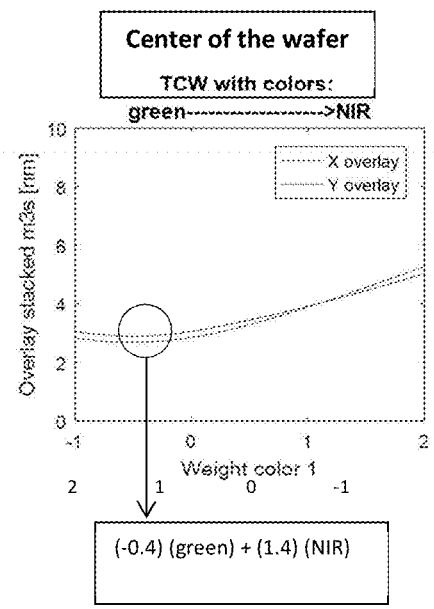
Figure 12a  Figure 12b
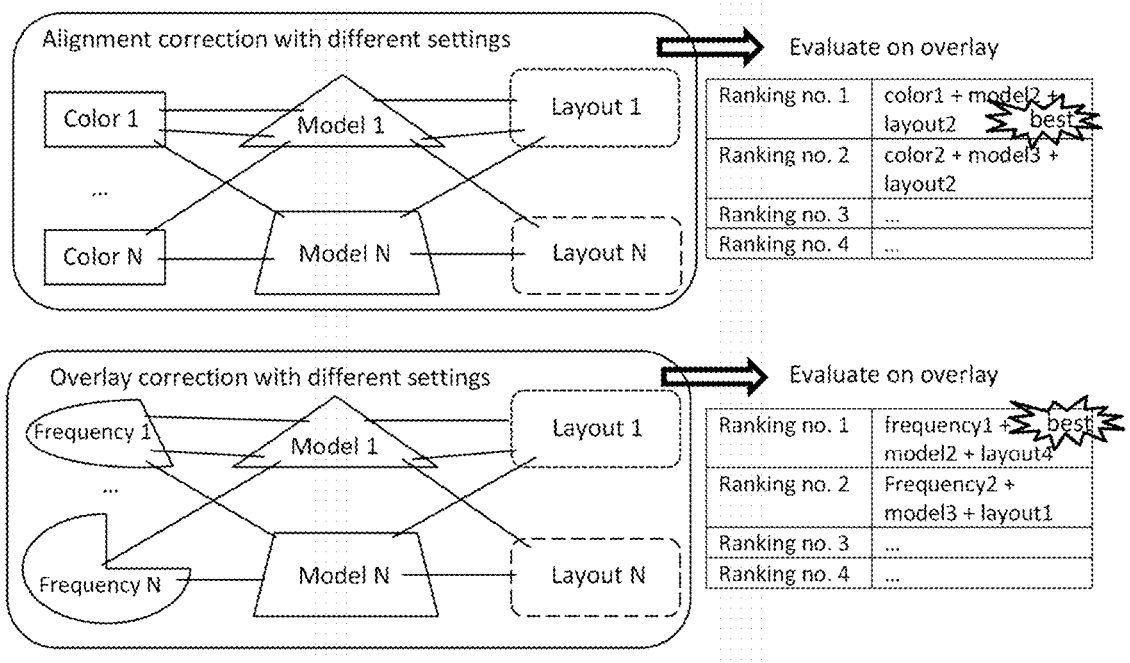
Figure 13

LITHOGRAPHIC METHOD

This application is a continuation of U.S. patent application Ser. No. 16/132,520, filed on Sep. 17, 2018, now U.S. Pat. No. 10,527,958, which claims the benefit of priority of European patent application no. 17193637, filed on Sep. 28, 2017, European patent application no. 18164511, filed on Mar. 28, 2018 and European patent application no. 18166720, filed on Apr. 11, 2018. The entire content of each of the foregoing applications is incorporated herein in its entirety by reference.

TECHNICAL FIELD

The present description relates to a lithographic method for manufacturing a device. More particularly the description relates to a method of measurement for alignment of substrates in a lithographic method.

BACKGROUND

Lithographic methods are used to apply a desired pattern onto a substrate, usually onto a target portion of the substrate. Lithography can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

Typically, the integrated circuits as manufactured include a plurality of layers containing different patterns, each layer being generated using an exposure process as described above. In order to ensure proper operation of the integrated circuit that is manufactured the layers consecutively exposed need to be properly aligned to each other. In order to realize this, substrates are typically provided with a plurality of so-called alignment marks (also referred to as alignment targets), whereby a position of the alignment marks is used to determine or estimate a position of a previously exposed pattern. As such, prior to the exposure of a subsequent layer, the position of alignment marks is determined and used to determine a position of the pattern that was previously exposed. Typically, in order to determine the positions of such alignment marks, an alignment sensor is applied which may e.g. be configured to project a radiation beam onto an alignment mark or target and determine, based on a reflected radiation beam, a position of the alignment mark. In a scanner, alignment markers are read out by the scanner alignment system and are instrumental to achieve a good positioning of each field on the substrate when subject to patterning steps provided by the scanner. Ideally, the measured position of the alignment mark would correspond to the actual position of the mark.

However, various causes may result in a deviation between the measured position and the actual position of the alignment mark. In particular, a deformation of the alignment mark may result in the mentioned deviation. Such a deformation may e.g. be caused by the processing of the substrate, for example etching, chemical mechanical polishing (CMP) or layer deposition leading to sub-optimal marker position determination. As a result, a layer may be projected or exposed on a position which is not in line, i.e. not aligned, with the previously exposed pattern, resulting in a so-called overlay error.

SUMMARY

According to an aspect, there is provided a method for determining one or more optimized values of an operational parameter of a sensor system configured for measuring a property of a substrate. The method comprises: determining a quality parameter for a plurality of substrates; determining measurement parameters for the plurality of substrates obtained using the sensor system for a plurality of values of the operational parameter; comparing a substrate to substrate variation of the quality parameter and a substrate to substrate variation of a mapping of the measurement parameters; and determining the one or more optimized values of the operational parameter based on the comparing.

The mapping may be a weighted sum, a non-linear mapping or a trained mapping based on machine learning methods.

The method may further comprise a step of determining an optimal set of weight factors for weighting the measurement parameter associated with the first value of the operational parameter and the measurement data associated with the second value of the operational parameter based on the comparing.

The quality parameter may be an overlay or focus parameter.

The measurement parameter may be a position of a feature provided to the plurality of substrates or an out-of-plane deviation of a location on the substrate.

The operational parameter may be a parameter associated with a light source from the sensor system. The operational parameter may be a wavelength, polarization state, spatial coherence state or temporal coherence state of the light source.

The quality parameter may be determined using a metrology system. The quality parameter may be determined using a simulation model predicting the quality parameter based on any of: context information, measurement data, reconstructed data, hybrid metrology data.

The optimized values of the operational parameter may comprise a set of first values associated with a first coordinate of the measurement parameters and a set of second values associated with a second coordinate of the measurement parameters.

The method may further comprise determining a third coordinate parallel to a first preferential direction of a mark, determining a fourth coordinate parallel to a second preferential direction of a mark, determining a set of third optimized values of the operational parameter associated with the third coordinate and a set of fourth optimized values of the operational parameter associated with the fourth coordinate, determining a transformation from the third and fourth coordinates to the first and second coordinates; and transforming the determined optimized values of the operational parameters in the third and fourth coordinates to optimised values of the operational parameters in the first and second coordinates, using the determined transformation.

The first values of the operational parameter may be optimised independently of the second value of the operational parameter.

The method may further comprise determining a characteristic of a stack applied to the substrate based on comparing the determined measurement parameters to modelled measurement parameters, wherein the model has the characteristic as an input. The method may further comprise updating the optimized values of the operational parameters based on the characteristic. The updating may be further based on an expected substrate to substrate variation of the quality parameter associated with using the updated optimized values of the operational parameters. The measurement parameter may be a measured position of an alignment mark and the quality parameter may be an overlay error. The method may further comprise determining a possible cause of a process excursion based on the determined characteristic of the stack. The stack may be applied in accordance with a processing recipe, the method further comprising making a determination based on the simulation to change the recipe.

In some embodiments determining the one or more optimized values of the operational parameter based on the comparing may be performed for different zones of the substrate. The different zones may comprise a zone proximate an edge of the substrate and a zone proximate a centre of the substrate. Each zone may comprise one or more alignment marks applied to the substrate. Each zone may correspond to an individual alignment mark of a plurality of alignment marks applied to the substrate.

In some embodiments the measurement parameter is a measured position of a mark and the quality parameter is a mark-to-device shift, the optimized values of the operational parameter being determined so as to optimize the quality parameter such that a substrate to substrate variation is minimal. The operational parameters may be parameters associated with a radiation source, radiation from the source being directed at the substrate, and the optimized value of the operational parameter is determined by applying a weighting for adjusting the measurements obtained utilising the operational parameter. The radiation from the source directed at the substrate may be collected by a sensor system after targeting the substrate. The weighting may include a lens heating effect of a lens used for directing radiation at the substrate and/or for collecting radiation by the sensor system. The method may further comprise determining the weightings for the operational parameters for measuring sub-segmented marks using measurements obtained from substrates having sub-segmented marks that have intentional mark-to-device shifts applied thereto so as to determine a sensitivity of the operational parameter to mark-to-device shifts.

In some embodiments the method may be used for optimizing operational parameters of metrology systems utilized to control processing of substrates. The sensor system may comprise a first sensor system associated with a first measurement system configured to measure a first characteristic of a substrate before processing and a second sensor system associated with a second measurement system configured to measure a second characteristic of the substrate after processing. The method may comprise: determining a first set of the measurement parameters for the plurality of substrates obtained using the first sensor system for the plurality of values of the operational parameter; determining a second set of the measurement parameters for the plurality of substrates obtained using the second sensor system for the plurality of values of the operational parameter; and comparing a substrate to substrate variation of the quality parameter and a substrate to substrate variation of a mapping of the measurement parameters for each of the first and second sets of measurement parameters. The determining of one or more optimized values of the operational parameters may comprise optimizing a first set of operational parameters associated with the first measurement system and a second set of operational parameters associated with the second measurement system simultaneously, wherein the optimizing mitigates a substrate to substrate variation of the second characteristic. The quality parameter may be an overlay determined from the measured second characteristic of the substrate after processing.

According to an aspect, there is provided a method for determining a condition of a semiconductor manufacturing process. The method comprises: determining the optimized value of the operational parameter according to a method described herein; comparing the determined operational parameter to a reference operational parameter; and determining the condition based on the comparison.

According to an aspect, there is provided a method of optimising measurement data from a sensor system configured for measuring a property of a substrate. The method comprises obtaining overlay data for a plurality of substrates. The overlay represents a deviation between a measured and an expected position of an alignment marker on a substrate and comprises a plurality of measurements of the alignment marker position made by a sensor system, each of the plurality of measurements utilising a different operational parameter of the sensor system. The method further comprises, based on the obtained overlay data, and for each of the different operational parameters, determining a weight for adjusting the measurements obtained utilising the operational parameter such that the weighted adjustments to the measurements made by the sensor system for all of the different operational parameters are combined to minimise the overlay.

The operational parameter may be a parameter associated with a radiation source from the sensor system. The operational parameter may be a wavelength, polarization state, spatial coherence state or temporal coherence state of the light source.

According to an aspect, there is provided a method of aligning a layer in an integrated circuit wafer. The method comprises using a sensor system to obtain a plurality of position measurements of an alignment marker on said wafer, wherein each of the plurality of measurements utilises a different operational parameter. For each of the plurality of alignment mark position measurements, a positional deviation is determined as a difference between an expected alignment mark position and a measured alignment mark position, the measured alignment mark position being determined based on the respective alignment mark position measurement. A set of functions are defined as possible causes for the positional deviations, the set of functions including a substrate deformation function representing a deformation of the substrate, and at least one mark deformation function representing a deformation of the one or more alignment marks. A matrix equation PD=M*F is generated, whereby a vector PD comprising the positional deviations is set equal to a weighted combination, represented by a weight coefficient matrix M, of a vector F comprising the substrate deformation function and the at least one mark deformation function, whereby weight coefficients associated with the at least one mark deformation function vary depending on applied alignment measurement. Values for the weight coefficients of the matrix M are determined based on overlays obtained for a plurality of substrates, the overlays representing deviations between measured and expected positions of alignment markers and comprising a plurality of measurements of the alignment marker positions made by the sensor system utilising the different operational parameters, the weights adjusting the measurements obtained utilising the different operational parameters such that the weighted adjustments to the measurements are combined to minimise the overlay. An inverse or pseudo-inverse matrix of the matrix M is determined, thereby obtaining a value for the substrate deformation function as a weighted combination of the positional deviations. The value of the substrate deformation function is applied to perform an alignment of the target portion with the patterned radiation beam.

BRIEF DESCRIPTION OF THE DRAWINGS

Exemplary embodiments are described herein with reference to the accompanying drawings, in which:

FIG. 12a and FIG. 12b are two graphs, one for a mark at the edge of the wafer and the other for a mark at the center, showing how overlay errors vary for two orthogonal directions as a function of different Two-Color Weighting (TCW) combinations.

FIG. 13 schematically shows processes for determining an OCW for an alignment correction, using multiple different colours, models and layouts, and for determining an overlay correction using multiple frequencies, models and layouts.

DETAILED DESCRIPTION

Figure 1:
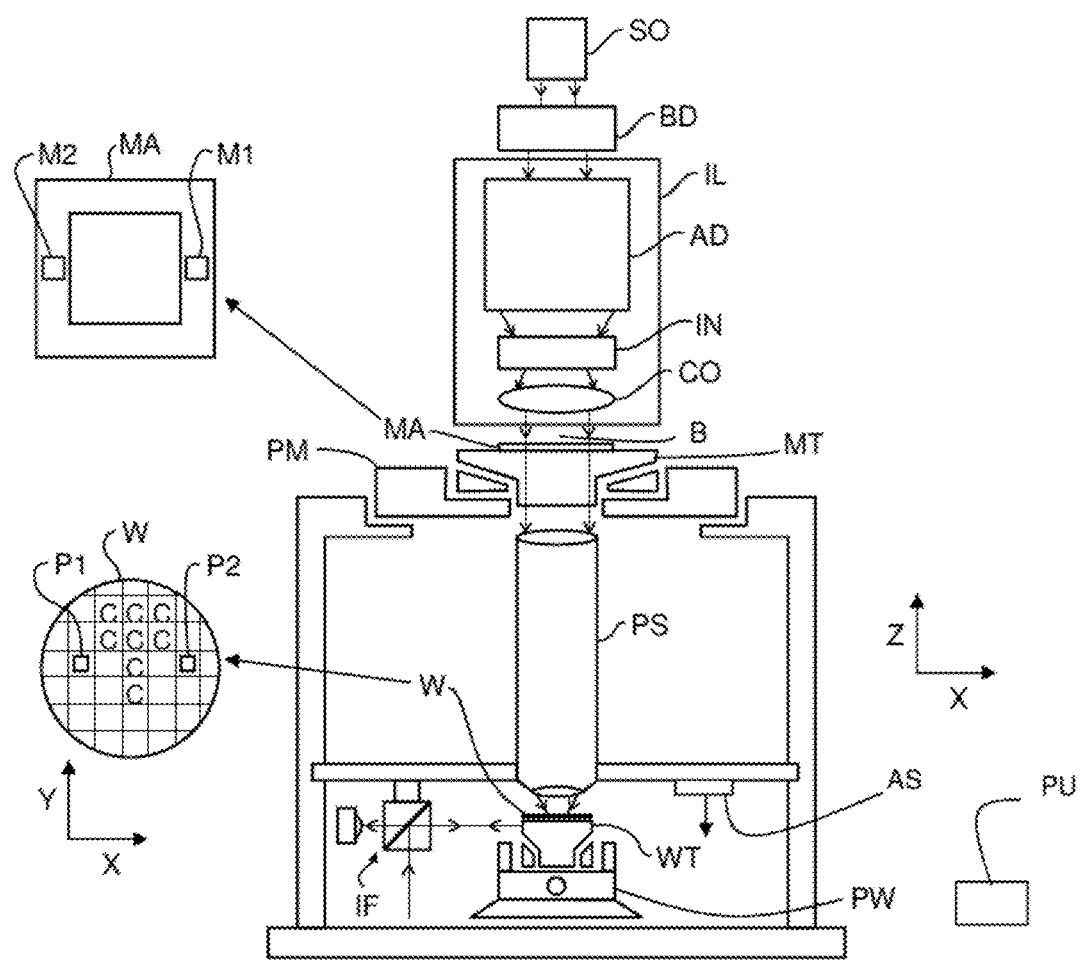
FIG. 1 depicts a lithographic apparatus according to an embodiment of the invention.

To aid understanding of the principles applied in embodiments of the invention, first there is described a lithographic apparatus and how this is used with reference to FIG. 1.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster ΔD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to mask-less lithography that utilizes programmable patterning device, such as a programmable mirror array of a type as referred to above.

Combinations and/or variations on the above described modes of use or entirely different modes of use may also be employed.

Embodiments of the present invention will typically be used with a lithographic apparatus as described above which further comprises an alignment system AS configured to determine a position of one or more alignment marks that are present on a substrate. The alignment system is configured to perform a plurality of different alignment measurements, thereby obtaining a plurality of measured alignment mark positions for the alignment mark that is considered. In this regard, performing different alignment measurements for a particular alignment mark means performing alignment measurement using different measurement parameters or characteristics. Such different measurement parameters or characteristics may e.g. include using different optical properties to perform the alignment measurement. As an example, the alignment system as applied in the lithographic apparatus according to an embodiment of the present invention may include an alignment projection system configured to project a plurality of alignment beams having different characteristics or parameters onto alignment mark positions on the substrate and a detection system configured to determine an alignment position based on a reflected beam off of the substrate.

After a wafer has been aligned and patterned during an exposure step, as described above, the wafer is subjected to metrology to check the accuracy of the patterning. A deviation between the actual (measured) position of the pattern and the desired position of the pattern, referenced to positions of patterns within a previous layer on the wafer, is typically referred to as an overlay error, or simply overlay. The overlay error associated with a process is a good indicator of the quality of the process. Hence overlay may be considered a quality parameter of the process. Overlay error is not the only relevant parameters indicative of the quality of the process. Also the focus error made when exposing a substrate (wafer) is important. Overlay errors are typically associated with positional errors in the plane of the substrate and hence are closely related to the performance of the alignment system. Focus errors are associated with positional errors perpendicular to the plane of the substrate and are closely related to the performance of another measurement system in the lithographic apparatus; the leveling system. Also the focus error may be considered a quality parameter of the lithographic process.

In general the quality parameter is measured by a metrology system (for example a scatterometer used to determine the overlay error). But in addition or alternatively to using the metrology system also predictions may be used to derive the quality parameter. Based on context data (for example knowledge of which processing apparatus have been used to process a substrate of interest) and measurement data not directly related to the quality data (for example wafer shape data being measured to predict overlay error) virtual metrology data may be reconstructed that is representative for directly measured quality parameter data. Often this concept is called "hybrid metrology"; a method to combine a variety of data sources and, when needed, simulation models to reconstruct metrology data associated with a quality parameter of interest (overlay and/or focus error). Alternatively a simulation model may be used to derive the quality parameter based on context data and/or measurement data. For example a simulation model may be utilized to mimic the lithographic process based on pre-exposure measurements (leveling data, alignment data) and context data (reticle layout, process information). The simulation model may by itself generate a map of quality parameter data (in this case predicted overlay).

Within the meaning of the present disclosure, the alignment system is operated at different operational parameters including at least a difference in polarization or a difference in wavelength (frequency) content of an alignment beam. The alignment system may thus determine, using the different operational parameters (e.g. using alignment beams having a different colors, i.e. frequency/wavelength), a position of an alignment mark. In general, the object of such alignment mark measurements as performed by the alignment system is to determine or estimate a position of the target portions (such as target portions C as shown in FIG. 1) of a next exposure process. Colloquially the term "colour" is used to refer to a beam having a particular measurement parameter, or set of measurement parameters. This different "colour" beams need not necessarily be beams having different colours within the visible spectrum, but may have different frequencies (wavelengths) or other properties, such as polarisations.

In order to determine these target portion positions, positions of alignment marks, which, for example, may be provided in scribe-lanes surrounding the target portions, are measured. When the alignment mark positions as measured deviate from nominal or expected positions, one can assume that the target portions where the next exposure should take place, also have deviating positions. Using the measured positions of the alignment marks, one may determine or estimate the actual positions of the target portions, thus ensuring that the next exposure can performed at the appropriate position, thus aligning the next exposure to the target portion.

In case a measured alignment mark position deviates from an expected or nominal position, one would be inclined to attribute this to a deformation of the substrate. Such a deformation of the substrate may e.g. be caused by the various processes to which the substrate is submitted.

When a plurality of measured alignment mark positions are available, and positional deviations, i.e. deviations of the expected alignment mark positions are determined, these deviations may e.g. be fitted to a function so as to describe the deformation of the substrate. This may e.g. be a two-dimensional function describing a deviation ($\Delta x$, $\Delta y$) as a function of an (x,y) position. Using such a function, one may then determine or estimate an actual position of a target portion where a pattern needs to be projected.

An alignment position measurement as performed by an alignment system may be disturbed by a deformation or asymmetry of the alignment mark itself. Phrased differently, due to a deformation of an alignment mark, a deviating alignment mark position measurement can be obtained, compared to a situation whereby the alignment mark is not deformed. In case no measures are taken, such deviating alignment mark position measurement could result in an erroneous determination of the alignment mark position. It has further been observed that this type of deviation, i.e. a deviating position measurement caused by an alignment mark deformation, depends on the utilized operational parameter. As an example, when an alignment mark position is measured using alignment beams having a different frequency, this may lead to different results, i.e. different measured positions for the alignment marks.

As such, when a position of an alignment mark is measured using a plurality of different operational parameters, e.g. using alignment beams having a different frequency, different results are obtained, e.g. a plurality of different alignment mark positions may be obtained based on the measurements.

As will be clear from the above, the outcome of the alignment measurement procedure should be an assessment of the actual substrate deformation, i.e. an assessment of the actual positions of the alignment marks, which may then be used to determine an actual position of the target portions for a subsequent exposure.

In view of the effects described, in particular the effects of the alignment mark deformations, the measured alignment mark positions (eg generically referred to as "measurement parameter"), i.e. the alignment mark positions as derived from the different measurements (i.e. using different operational parameters) are both affected by the actual (unknown) substrate deformation and by occurring (unknown) mark deformations.

Both effects may lead to a deviation between an expected alignment mark position and a measured alignment mark position. As such, when a position deviation is observed, it may either be caused by an actual substrate deformation or by an alignment mark deformation or by a combination thereof.

Figure 2A:
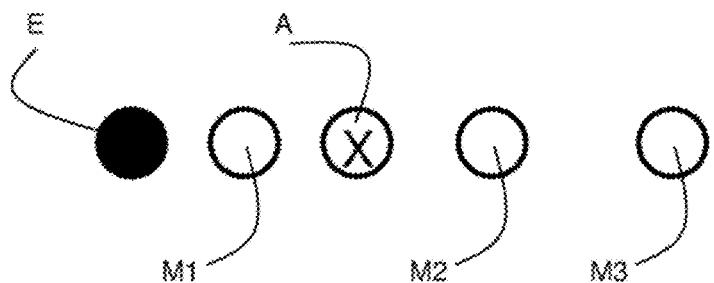
FIGS. 2a, 2b and 2c depict several possible alignment measurement results when applying different measurement parameters.

FIG. 2 schematically depicts some possible scenarios; Assuming that three measurements M1, M2, M3 are performed to determine a position of an alignment mark X. FIG. 2a schematically shows the nominal or expected position E of the alignment mark and the measured positions M1, M2, M3. FIG. 2a further shows the actual position A of the alignment mark. As can be seen, none of the measurements performed provide in an accurate representation of the actual position deviation (E-A)

The scenario as depicted in FIG. 2a thus involves an actual displacement of an alignment mark (the actual alignment mark position A differs from the expected position E) combined with a mark deformation causing deviating measurements.

Figure 2B:
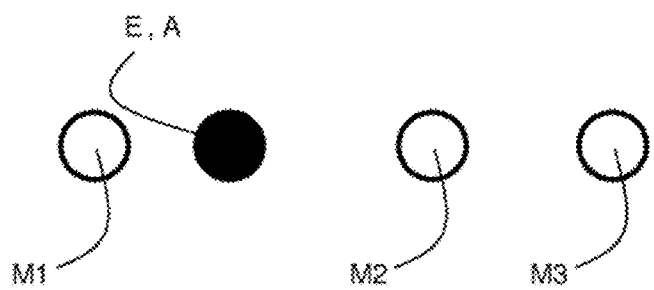

FIG. 2b shows an alternative scenario whereby differences are observed in the measurements (M1, M2, M3), the measurement parameters (in this case measured positions) differing from the expected value of the measurement parameter (eg position E), while the actual position A is assumed to coincide with the expected position E. In this scenario, the measurements would imply that there is a positional deviation of the alignment mark, whereas, in reality, there is none, i.e. the position of the alignment mark is not affected by a substrate deformation.

Figure 2C:

FIG. 2c schematically shows a third scenario whereby all three measurements M1, M2, M3 coincide and coincide with the actual position A. Such a scenario may occur when there is no alignment mark deformation affecting the measurements.

As will be clear from the various scenarios depicted, one needs to be able to distinguish between the effects of a mark deformation and the effect of a substrate deformation, in order to arrive at a proper assessment of the actual alignment mark position.

An embodiment of the present invention provides in a method to realize such a separation of both effects. In an example, the lithographic apparatus may include a processing unit PU (see FIG. 1) to perform the required operations to separate both effects. Such a processing unit PU may therefore include a processor, microprocessor, computer or the like.

Figure 3:
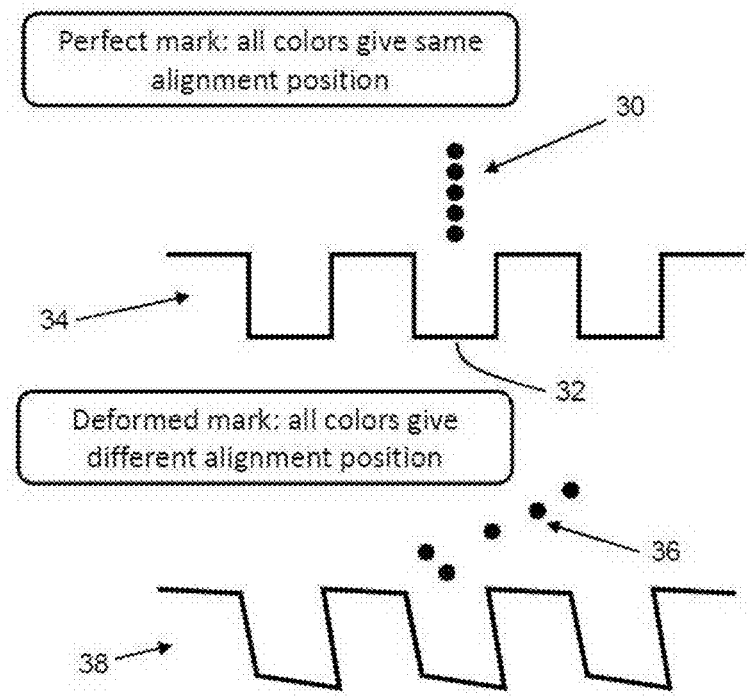
FIG. 3 illustrates how different operational parameters of a sensor may be affected when making measurements on a substrate.

FIG. 3 illustrates the basic physical principle behind embodiments of the invention (often referred to as an "optimal color weighting (OCW)" concept when the operational parameter of interest is the color of the alignment beam). The top diagram shows that, in an ideal situation, all colors used in a multi-color measurement would produce the same alignment position indications 30 for a marker 32 on a geometrically perfect substrate 34, but in reality, for the reasons explained above and as shown in the bottom diagram, different colors result in different position indications 36 for a real (i.e. non-perfect) substrate 38.

Figure 5:
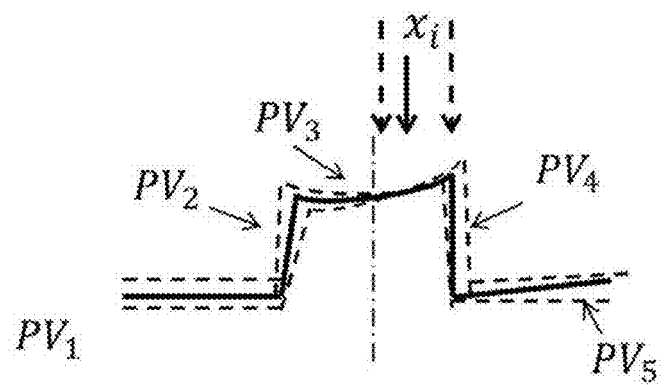
FIG. 5 depicts a marker having different types of mark deformation.
Figure 4:
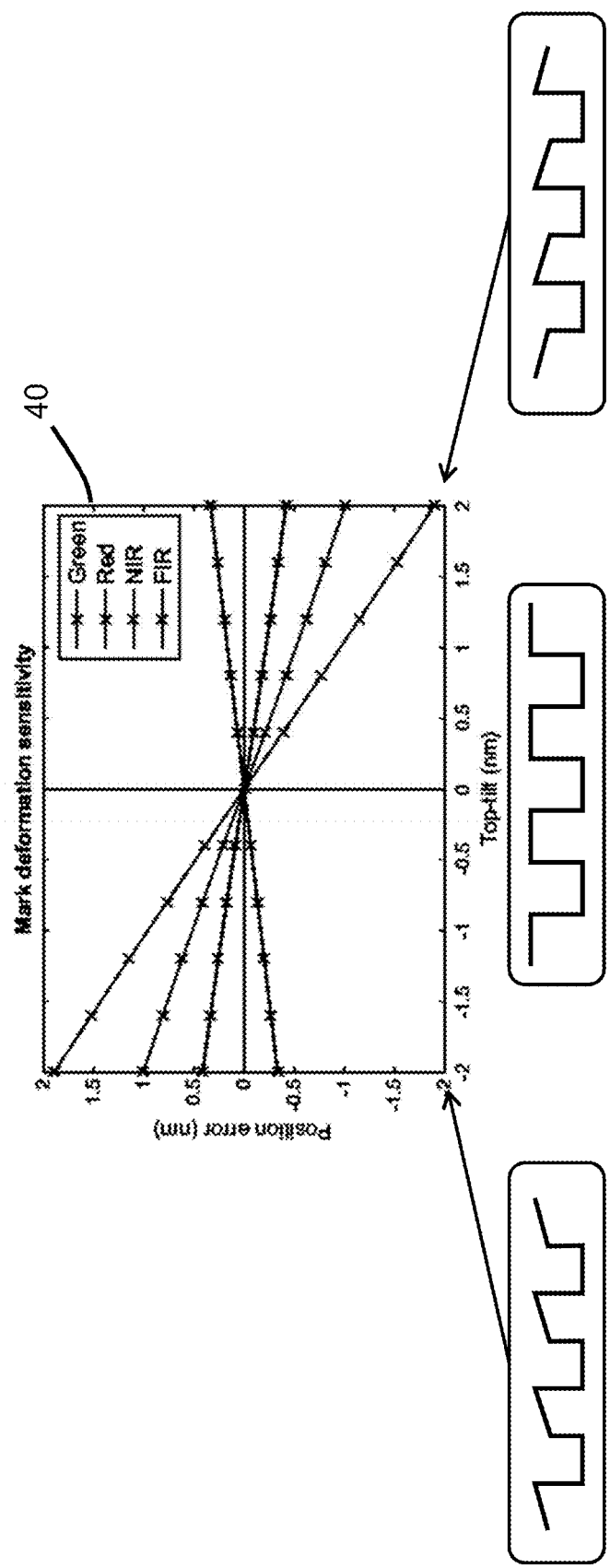
FIG. 4 is a graph showing how different operational parameters may be affected by mark deformation.

FIG. 4 shows how different colors may be affected by mark deformation, and that the position errors of each color, a shown in the graph 40 can be assumed to vary linearly with the degree of deformation (angle of top tilt of the mark). In that case it might be possible to determine a single color as providing a best indicator of the true mark position. However, as shown in FIG. 5, where multiple different types of mark deformation may be present, no single color may provide a best fit for all deformation types. In reality it has been found that mark deformation induced errors scale differently for different colors (e.g. wavelengths or polarizations) as well as depending on layer thickness variations and the type of mark being measured. OCW based methods target to determine an optimal combination of all the different colors used to minimize the impact marker deformations have on the determined marker positions.

Processing variation (PV), including mark-deformation causes variation in aligned position to shift for color i, within the wafer and from one wafer to another, (PV). The OCW solution moves away from a single best color, but allows all colors ($\bar{x}$) to define the aligned position. A 'weight' wi, is added to each color (xi), to arrive at a linear combination of xi's to define a process robust aligned position $\bar{y}$.

Accordingly, embodiments of the invention address the problem of alignment marks being deformed by process variations (PV) wafer-to-wafer leading to on-product overlay errors. The OCW solution involves:

Defining OCW position as a linear weighted combination of alignment positions x.

Minimizing the process sensitivity of y to process variation by taking an optimal linear combination such, that wafer-to-wafer overlay error is minimized.

The optimal weight for each color/polarization is determined using training with overlay data.

Preferably the overlay data are obtained from measurements made on wafers that have undergone similar processing, and wherein both the measurements and the processing have been performed using the same or similar equipment.

The mathematical principles used to determine color weights $\bar{w}$ based on overlay data are as follows.

OCW position, y, is a weighted sum over M measured color positions, $\bar{x}$ $$y = \sum_{m=1}^{M} w_m x_m = \underline{w}^T \cdot \underline{x}$$

Given N measured marks $$\underline{y} = \begin{bmatrix} y^{(1)} \\ y^{(2)} \\ \vdots \\ y^{(N)} \end{bmatrix}$$

$$X = \begin{bmatrix} (\underline{x}^{(1)})^T \\ (\underline{x}^{(2)})^T \\ \vdots \\ (\underline{x}^{(N)})^T \end{bmatrix} = \begin{bmatrix} x_1^{(1)} & x_2^{(1)} & \ldots & x_M^{(1)} \\ x_1^{(2)} & x_2^{(2)} & \ldots & x_M^{(2)} \\ \vdots & \vdots & \ddots & \vdots \\ x_1^{(N)} & x_2^{(N)} & \ldots & x_M^{(N)} \end{bmatrix}$$

Optimize weights to minimize decorrected overlay, $\underline{y}_{ovl,decorr}$ $$\underline{y}_{ovl,decorr} = X\underline{w}$$

where decorrected overlay=overlay−applied wafer alignment

Color weights $\overline{w}$ are then found from $$\underline{w} = [X^T X]^{-1} X^T \underline{y}_{ovl,decorr}$$

Regular OCW

As described above, Optimal Colour weighting (OCW) determines the optimal colour weight factors in an alignment recipe which may be to achieve minimal overlay variation of patterns on a wafer. An OCW may be determined at multiple positions on a mark. Positions on a mark may be described using a two-dimensional representation, which may be a set of coordinates, for example 2D-coordinates u, v. The set of u, v coordinates may be linear coordinates, that is to say, they are expressed in relation to two axes, the u-axis, and the v-axis, the axes having different directions not parallel to each other. The directions of the u and v axes may be referred to as the directions of the u and v coordinates, respectively. The u, v coordinates may be orthogonal coordinates, or orthonormal coordinates. The axes of u and v may be aligned independently of the mark. OCW may be trained on previously obtained alignment and overlay data. The colour weight factors may be trained and applied independently for the u and v directions. The colour weight factors may alternatively be trained for u and v combined, but independent training results in better overlay performance.

Mathematically, one implementation of the determination of colour weights for two independent directions may be as follows:

$$u_{ocw} = \sum_{col} w_{u_{col}} u_{col}, \quad v_{ocw} = \sum_{col} w_{v_{col}} v_{col}$$

In the above equations the weight factors $w_{u_{col}}$ and $w_{v_{col}}$ are determined to optimize overlay performance, resulting in OCW determined positions $u_{ocw}$ and $v_{ocw}$. One or more further restrictions may be placed on the colour weights, for example to achieve that the nominal mark position, wafer load, and wafer deformation are unaffected by the weight factors. This may be achieved by adding a requirement that the sum of all the colour weights must be equal to 1, that is to say, the weights add up to 100%, for both independent directions u and v:

$$\sum_{col} w_{u_{col}} = 1, \quad \sum_{col} w_{v_{col}} = 1$$

In the above implementation, the colour weights in the u and v directions are calculated independently, however, the notation of the above set of calculations for u and v can be combined into a single notation in matrix form:

$$\begin{pmatrix} u_{ocw} \\ v_{ocw} \end{pmatrix} = \sum_{col} \begin{pmatrix} w_{u_{col}} & 0 \\ 0 & w_{v_{col}} \end{pmatrix} \times \begin{pmatrix} u_{col} \\ v_{col} \end{pmatrix} = \sum_{col} W_{col} \times \begin{pmatrix} u_{col} \\ v_{col} \end{pmatrix}$$

$$\sum_{col} \begin{pmatrix} w_{u_{col}} & 0 \\ 0 & w_{v_{col}} \end{pmatrix} = \sum_{col} W_{col} = I$$

In the above matrix notation, each colour $u_{col}$, $v_{col}$ gets its own weight matrix $W_{col}$, wherein each $W_{col}$ contains the colour weights for both the u and v direction coordinates. In the implementation of OCW described by the calculations above, each of the weight matrices $W_{col}$ is a diagonal matrix, meaning the elements not located on the main diagonal are equal to zero. As can be seen from the matrix equations above, this indicates that the calculation of $u_{ocw}$ does not include terms dependent on $v_{col}$, and similarly that the calculation of $v_{ocw}$ does not include terms dependent on $u_{col}$, and therefore the calculation of colour weights is independent for the u and v directions in this implementation of OCW.

OCW by Segment

Figure 15:
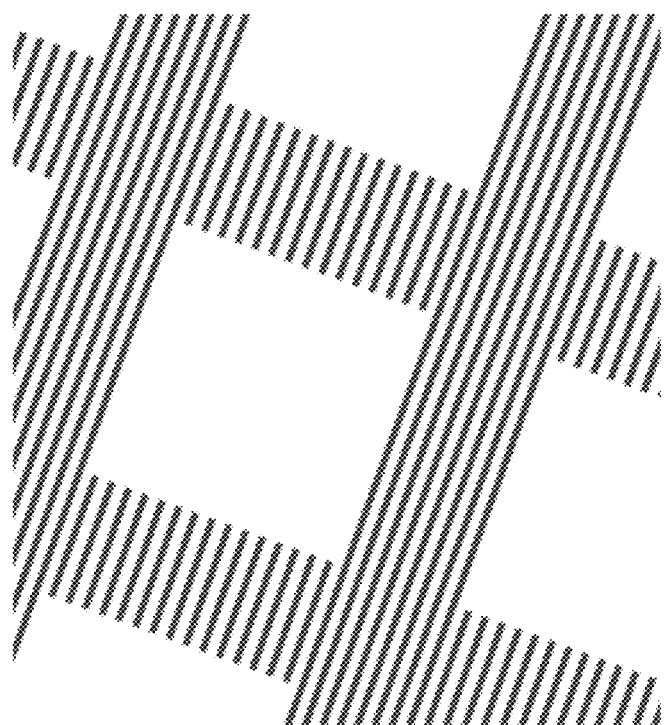
FIG. 15 depicts an alignment mark comprising two sets of gratings.

An alignment mark may comprise structures that have one or more preferential directions. For example, the mark may be a sieve BF mark as shown in FIG. 15, comprising 2 gratings, the direction of which may not be aligned to the coordinates used for OCW. If the subsegmentation of a sieve BF mark, that is to say, its pitch and direction, are not aligned with the coordinates u, v, the OCW may result in different effects for different angles, making the OCW results less consistent for different wafers, leading to a decreased stability of wafer to wafer (overlay) performance.

In cases where an alignment mark has preferential directions, for example dominant directions in the mark structure, which are not aligned with the u, v coordinates, it may be preferable to perform OCW using a new, alternative, set of coordinates to determine the colour weights, wherein the new coordinate directions match one or more preferential directions of the mark. For example, in case of a sieve BF mark, the grating directions as shown in FIG. 15 could be used as preferential directions to determine new coordinates u', v'. In some implementations, performing OCW may therefore comprise determining a new set of coordinates u', v', wherein the u', v' directions may be aligned to the preferential directions of the mark, for example the pitch directions of the sieve BF mark. The new coordinates u', v' may be chosen independently from the old coordinates u, v. In this implementation, which may be referred to as OCW by segment, the new coordinates are used to perform OCW as set out for the regular OCW method above. In case the expression of one or more of the determined OCW positions and colour weights is required in the old set of coordinates u, v. a coordinate transformation from the new set u', v' to the old set u', v' of coordinates can be performed after the colour weights have been determined.

The mathematical principles used to determine colour weights based on overlay data using the OCW by segment method are as follows:

Take $\varphi_1$ and $\varphi_2$ to be the angles of the normals to the new directions u' and v' relative to the positive u direction of the coordinates. The angles $\varphi_1$ and $\varphi_2$ may not be the same, nor may they form an angle of 180° between each other, that is to say, the directions u' and v' may not be parallel. Angles $\varphi_1$ and $\varphi_2$ may be orthogonal, or may form another angle between each other.

The relation between the new coordinates and the old coordinates can be expressed as:

$$\begin{pmatrix} u'_{col} \\ v'_{col} \end{pmatrix} = T \times \begin{pmatrix} u_{col} \\ v_{col} \end{pmatrix} = \begin{pmatrix} \cos\varphi_1 & \cos\varphi_2 \\ \sin\varphi_1 & \sin\varphi_2 \end{pmatrix} \times \begin{pmatrix} u_{col} \\ v_{col} \end{pmatrix}$$

The OCW is performed using the method described above, using the new set of coordinated u' and v', wherein the colour weights for u' and v' are calculated independently of each other:

$$\begin{pmatrix} u'_{ocw} \\ v'_{ocw} \end{pmatrix} = \sum_{col} \begin{pmatrix} w'_{u_{col}} & 0 \\ 0 & w'_{v_{col}} \end{pmatrix} \times \begin{pmatrix} u'_{col} \\ v'_{col} \end{pmatrix} = \sum_{col} W'_{col} \times \begin{pmatrix} u'_{col} \\ v'_{col} \end{pmatrix}$$

$$\sum_{col} \begin{pmatrix} w'_{u_{col}} & 0 \\ 0 & w'_{v_{col}} \end{pmatrix} = \sum_{col} W'_{col} = I$$

In order to express $u'_{ocw}$ and $v'_{ocw}$ in relation to the set of coordinates u, v, a transformation from the new coordinate system to the old coordinate system is performed, according to:

$$\begin{pmatrix} u_{col} \\ v_{col} \end{pmatrix} = T^{-1} \times \begin{pmatrix} u'_{col} \\ v'_{col} \end{pmatrix} = \frac{1}{\det T} \begin{pmatrix} \sin\varphi_2 & -\cos\varphi_2 \\ -\sin\varphi_1 & \cos\varphi_1 \end{pmatrix} \times \begin{pmatrix} u'_{col} \\ v'_{col} \end{pmatrix}$$

Which leads to the following equation:

$$\begin{pmatrix} u_{ocw} \\ v_{ocw} \end{pmatrix} = \sum_{col} T^{-1} \times W'_{col} \times T \times \begin{pmatrix} u_{col} \\ v_{col} \end{pmatrix} = \sum_{col} W_{col} \times \begin{pmatrix} u_{col} \\ v_{col} \end{pmatrix}$$

From this $W_{col}$, expressed in u, v coordinates is $$W_{col} = \frac{1}{\det T} \begin{pmatrix} w'_{u_{col}}\cos\varphi_1\sin\varphi_2 - w'_{v_{col}}\cos\varphi_2\sin\varphi_1 & (w'_{u_{col}} - w'_{v_{col}})\cos\varphi_2\sin\varphi_2 \\ (w'_{v_{col}} - w'_{u_{col}})\cos\varphi_1\sin\varphi_1 & w'_{v_{col}}\cos\varphi_1\sin\varphi_2 - w'_{u_{col}}\cos\varphi_2\sin\varphi_1 \end{pmatrix}$$

Using OCW by segment, the colour weights are determined independently for the two directions in the new coordinates u', v'. Expressed in new coordinates u', v', the OCW positions $u'_{ocw}$ and $v'_{ocw}$ being independent of each other means that $u'_{ocw}$ does not depend on $w'_{v_{col}}$ weights or $v'_{col}$ positions, and $v'_{ocw}$ does not depend on $w'_{u_{col}}$ weights or $u'_{col}$ positions. When the determined OCW positions are expressed in old coordinates u, v, wherein $u_{ocw}$ and $v_{ocw}$, are expressed as a function of $w'_{u_{col}}$ and $w'_{v_{col}}$, the optimized positions $u_{ocw}$ and $v_{ocw}$ may both be written as a weighted combination of colours in both the u and v directions, $u_{col}$ and $v_{col}$, and both colour weights $w'_{u_{col}}$ and $w'_{v_{col}}$. If the sum of weights constraint is satisfied for the coordinates u', v', the constraint is also satisfied for the corresponding colour weights expressed in coordinates u, v:

$$\sum_{col} W_{col} = I$$

An example of this OCW by segment is provided below for a sieve BF mark which has preferred directions which have angles $\varphi_1=-45°$ and $\varphi_2=45°$. The old coordinates may be described as u having a direction of 0° and v having a direction of 90°. For this specific example, following the OCW by segment algorithm set out above, the colour weights matrix, expressed in coordinated u and v, can be written as:

$$W_{col} = \frac{1}{2} \cdot \begin{pmatrix} w'_{u_{col}} + w'_{v_{col}} & w'_{u_{col}} - w'_{v_{col}} \\ w'_{v_{col}} - w'_{u_{col}} & w'_{u_{col}} + w'_{v_{col}} \end{pmatrix}$$

From this colour weights matrix determined for new coordinates based on transformed coordinate angles of $\varphi_1=-45°$ and $\varphi_2=45°$, the OCW positions expressed in u and v can be written as:

$$u_{ocw} = \frac{1}{2} \sum_{col} (w'_{u_{col}} + w'_{v_{col}}) \cdot u_{col} + (w'_{u_{col}} - w'_{v_{col}}) \cdot v_{col}$$

$$v_{ocw} = \frac{1}{2} \sum_{col} (w'_{v_{col}} - w'_{u_{col}}) \cdot u_{col} + (w'_{u_{col}} + w'_{v_{col}}) \cdot v_{col}$$

Extended OCW

In the example of regular OCW based on u, v coordinates, the colour weights $w_{u_{col}}$ and $w_{v_{col}}$ for the u and v directions are determined independent from each other. In OCW by segment, the colour weights $w'_{u_{col}}$ and $w'_{v_{col}}$ are determined independently from each other using u', v' coordinates, but when expressing the OCW positions in old coordinates u, v, $u_{ocw}$ and $v_{ocw}$ are not independent from the weights $w'_{u_{col}}$ and $w'_{v_{col}}$ and colours, $u_{col}$ and $v_{col}$, linked to the other direction. Both methods provide 2 degrees of freedom in determining the optimal colour weights, by determining colour weights in two directions, independently.

In some implementations of OCW the number of degrees of freedom used to determine the OCW positions is further increased to be more than 2 per colour. This may be achieved by adding additional coefficients to the colour weights for determining the OCW positions. Specifically, increasing the degrees of freedom may be determined by adding separate colour weight elements at one or more positions of the colour weights matrix not on the main diagonal. The resulting colour weight matrix comprises more than two separate colour weights, independent from each other. The colour weights are independent because the value of one colour weight does not depend on the value of any one or more of the other separate colour weights.

This approach differs from the OCW by segment, which may have non-zero colour weight matrix elements in positions other than on the main diagonal, but each of the colour weight matrix elements is interconnected as a function of only two separate independent colour weights, $w'_{u_{col}}$ and $w'_{v_{col}}$.

An implementation of OCW with more than two degrees of freedom is extended OCW, where two additional independent colour weights are added to each colour weights matrix for determining OCW:

$$W_{col} = \begin{pmatrix} w_{uu_{col}} & w_{uv_{col}} \\ w_{vu_{col}} & w_{vv_{col}} \end{pmatrix}$$

In extended OCW, the above colour weight matrix is used to determine $u_{ocw}$ and $v_{ocw}$. The four separate colour weights $w_{uu_{col}}$, $w_{uv_{col}}$, $w_{vu_{col}}$, $w_{vv_{col}}$ can all be determined independently of each other. The above matrix is used in extended OCW to calculate OCW positions $u_{ocw}$, $v_{ocw}$:

$$\begin{pmatrix} u_{ocw} \\ v_{ocw} \end{pmatrix} = \sum_{col} W_{col} \times \begin{pmatrix} u_{col} \\ v_{col} \end{pmatrix}$$

In extended OCW, the sum of weights constraint may also be applied, that is to say, the following set of equations, here written in matrix form, may be required to be satisfied by the colour weights:

$$\sum_{col} W_{col} = I$$

In non-matrix form, the extended OCW equations may be written as:

$$u_{ocw} = \sum_{col} w_{uu_{col}} \cdot u_{col} + w_{uv_{col}} \cdot v_{col}$$

$$v_{ocw} = \sum_{col} w_{vu_{col}} \cdot u_{col} + w_{vv_{col}} \cdot v_{col}$$

and $$\sum_{col} w_{uu_{col}} = 1, \sum_{col} w_{vv_{col}} = 1, \sum_{col} w_{uv_{col}} = 0, \sum_{col} w_{vu_{col}} = 0,$$

If a mark comprises one, more, or all features across a plurality of directions, that have been formed as part of the same process layer, then deformation occurring in that process layer may affect features in some or all of those multiple directions. For example, a mark may have features in the u and v directions, or u' and v' directions, that have been affected by corresponding and/or correlating deformations. In such cases making optimized colour weight positions dependent on colour positions of both directions may lead to more accurate results, and therefore extended OCW may provide increased and better optimization, improving overlay.

The described method of linear weighting applied to the measurement parameters (alignment data) can be generalized to a mapping of the measurement parameters. As previously described the mapping is typically a linear weighted sum of measurement parameters. However an embodiment of the invention is not limited to linear weighted sums, but also trained mappings, such as utilized in machine learning algorithms may be utilized.

The described method of optimal color weighting is not limited to a the use of colors as the operational parameter of interest, also different polarization modes may be utilized to derive different measurement parameters as measured by for example an alignment sensor system (measuring mark positions). Also a degree of coherence may be considered an operational parameter (in case the degree of coherence is adjustable, for example by adjusting a laser characteristics a temporal and/or spatial coherence may be adjusted). Also different measurement parameters may be considered, for example in case the operational parameter is a colour and the sensor system is a level sensor the measurement parameter would be a focus value associated with the substrate subject to the level sensor measurements. The quality parameter associated with the level sensor measurements is the focus error made during exposure of the substrate.

Figure 6A:
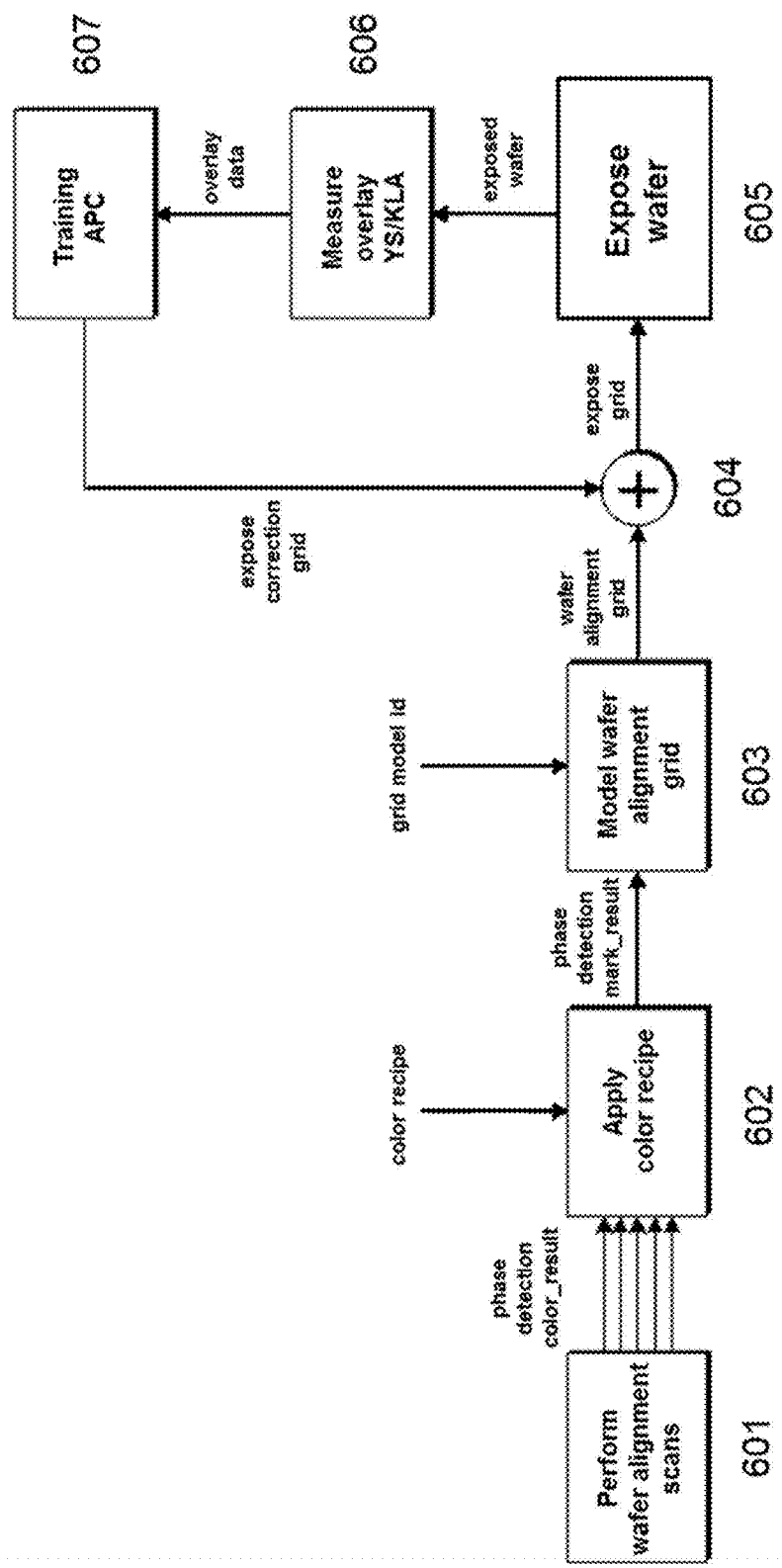
FIG. 6a is a flow diagram illustrating schematically a wafer alignment, exposure and overlay measurement process.

FIG. 6a is a flow diagram illustrating schematically a wafer alignment, exposure and overlay measurement process. As shown, at step 601 wafer alignment scans are carried out using a number of different colors (operational parameters of the sensor system). At step 602 a color recipe is used to determine how the different color measurements should be applied to determine the wafer marker positions for aligning the wafer. At step 604 the wafer (or layer) is aligned by the apparatus using the determined marker positions from the previous step. At step 604 an adjustment to the wafer positioning is made based on data that is provided from measurements made to the wafer at the previous stage (i.e. after the underlying layer of the wafer was processed). At step 605 the wafer is then exposed to the processing stage (as described above with reference to FIG. 1). At step 606 the overlay measurement is made and the overlay data provided to the training data processor (APC). At step 607 the APC evaluates the overlay data to determine any deviations from the expected positions, and uses this to provide a correction to the alignment of the next wafer/layer.

Figure 6B:
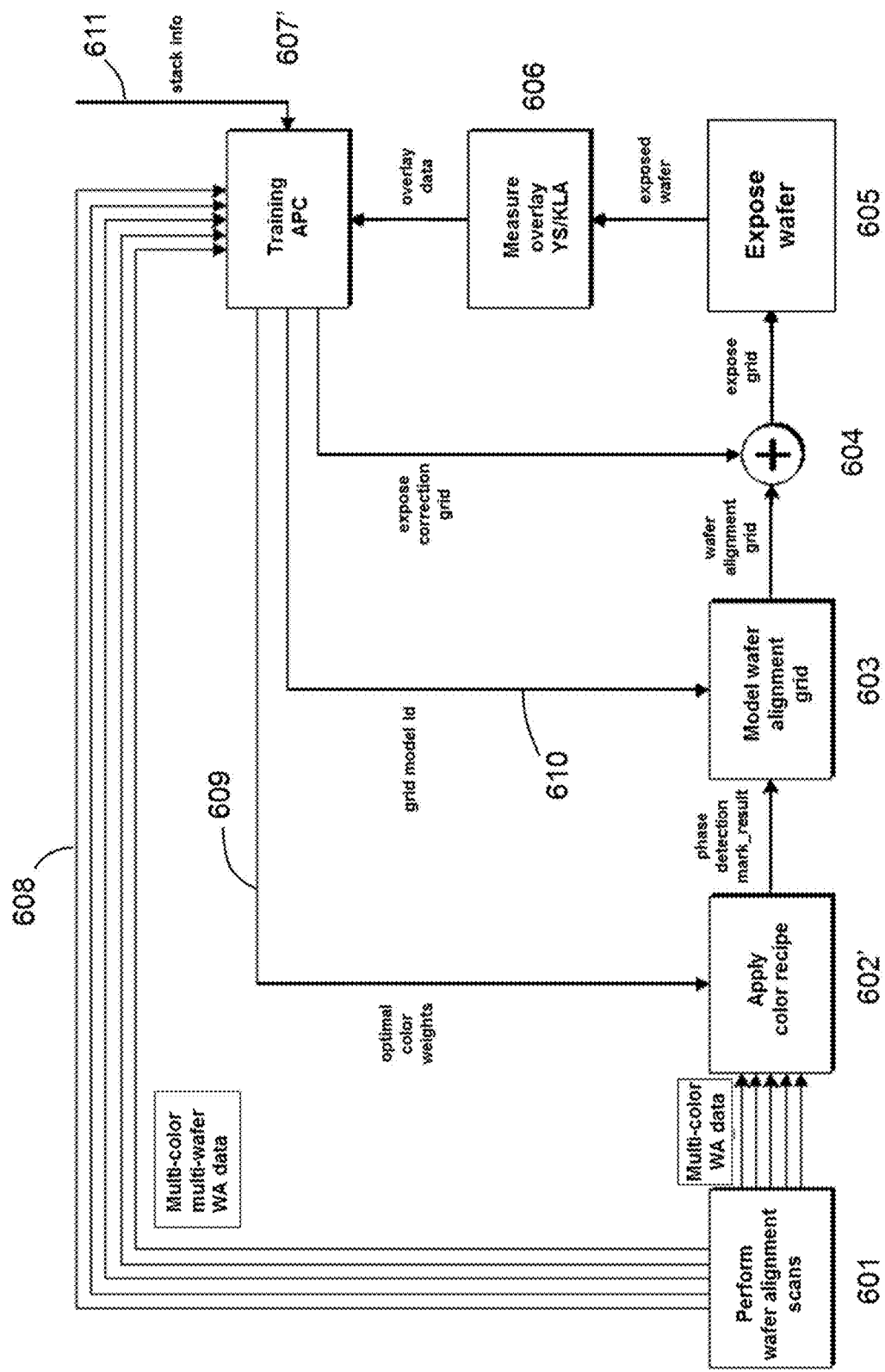
FIG. 6b is a flow diagram illustrating schematically another wafer alignment, exposure and overlay measurement process.

FIG. 6b is a flow diagram illustrating schematically another wafer alignment, exposure and overlay measurement process. The same steps described above for FIG. 6a have the same reference numerals in FIG. 6b. One difference is that at step 602', which occurs at the same place as step 602 in FIG. 6a, instead of applying the same color recipe each time, optimal color weights are used to determine the marker positions for aligning the wafer. Another difference is that at step 607', instead of simply determining the alignment corrections as determined from the overlay, more data is used as training data. This data includes the alignment measurement data 608 for each of the colors obtained at step 601 as well as overlay data from previous wafer measurements (step 606). Any other relevant data, such as stack data 611 may also be used for the training data. The training data is then used not only to provide the wafer positioning alignment correction at step 604, but also to update the optimal colour weights 609 used at step 602' and to update a substrate grid model 610 used at step 603.

It will be apparent from FIG. 6b that the system is learning as it is being used, continually updating the weights for the OCW measurements and alignment procedure. Thus a major advantage of the methods described above is that any local, apparatus specific variance in the operational parameters of the sensor system employed will be taken into account and corrected. The more the sensor system and apparatus is used, the better the alignment will become.

The optimal color weighting (OCW) techniques described herein combine alignment information from all wavelengths measured simultaneously and calculate an optimal set weights to be used in a linear combination of colors such that measured alignment position is least sensitive to mark deformation. However the nature of the stack in which the markers are etched or the stack covering the marks may change in time. When the change affects optical properties of the stack(s) (refractive index for example), also the response of the marks to the various operational parameters (colors, polarization state) may change accordingly. The implications of such changes of stack properties may be that a certain optimal set of weights to be used in a linear combination of operational parameters may no longer be optimal.

In addition mark deformation may change in time, due to for example changes in characteristics of processing equipment (like CMP tools and deposition equipment). The mark deformation may for example change from a floor tilt like deformation to a top tilt deformation and/or a side wall angle change of the mark when etched into the substrate. The consequence of a change in mark deformation characteristics may be that a previously determined optimal set of weights associated with the linear combination of colors is not optimal anymore (eg. will cause sub-optimal alignment of substrates and hence overlay may suffer).

It is proposed in this disclosure to periodically determine the optimal set of weights giving the minimum amount of overlay variation between substrates. In case the calculated substrate to substrate variation of the quality parameter based on the determined set of weights deviates significantly from a previously observed wafer to wafer variation of the quality parameter it is likely that a change of one or more processes within the semiconductor manufacturing process has occurred. Alternatively stated: in case a new set of weights which is determined based on newly observed substrate to substrate variation of the quality parameter deviates significantly from a previously determined set of weights it is likely that a change of one or more processes within the semiconductor manufacturing process has occurred.

In an embodiment a condition of a semiconductor manufacturing process is determined by a) determining an optimized value of the operational parameter (for example new set of weights associated with colors of alignment), and b) comparing the determined operational parameter to a reference operational parameter (for example previously determined set of weights associated with colors of alignment), and c) determining the condition based on the comparison.

In case of a previously determined set of weights associated with colors of an alignment sensor the reference operational parameter may be represented as a vector. When for example the optimal weights are +1 for the color red and −1 for the color green the reference operational parameter may be represented as the vector <1,−1>. This vector has no component parallel to its orthogonal complement <1,1>. For example the component vector <1,−1> is associated with a top tilt deformation of an (etched) alignment mark and the component vector <1,1> with a sidewall angle deformation of the (etched) mark. In case of a process change the new optimal set of weights may become 1.2 for the color red and 0.6 for the color green. The new optimized value of the operational parameter may now be represented by the vector 1.2*<1,−1>+0.6*<1,1>. Obviously the vector <1,1> became more relevant, indicating that the etched alignment mark became (also) deformed according to a sidewall angle profile. By monitoring the vector representation of the optimum operational parameter the semiconductor manufacturing process may be monitored.

In an embodiment the optimal set of weights is initially determined based on the quality parameter (substrate to substrate) variation and its sensitivity to the variation of the operational parameters. Subsequently measured substrates are further characterized by an orthogonal (or orthonormal) set of vectors representing the ratio of operational parameters present within the substrate to substrate variations of the measurement data. For example when alignment data associated with the color red demonstrates a wafer dependent variations f(w_i) (function of wafer "w_i") and the alignment data associated with the color green −f(w_i), it is said that the vector representation <1,−1> is present in the measurement data. In case of occurrence of a process change it may happen that the variation of the alignment data changes; for example the color red may demonstrate a wafer dependent variation 3*g(w_i), while the color green may demonstrate a wafer dependent variation g(w_i), which vector representation is <3,1>. The vector <3,1> may be written as its projection 1*<1,−1,> on <1,−1> and its projection 2*<1,1,> on <1,1> (<1,1> is the orthogonal complement of <1,−1>). The process change hence introduced a component <1,1> into the variation of the measurement data which was not present before. The optimal set of weights may now be optimized such that they suppress the strongest components (vectors with largest amplitude) observed in that measurement data set. It is proposed to periodically project newly measured operational parameters onto the orthogonal basis corresponding to the original moment of calibration of the optimal set of weights. When the distribution of amplitudes over the vectors has changed, it is likely that a process change has occurred.

In an embodiment the condition of a semiconductor manufacturing process is monitored by: a) obtaining an optimized value of the operational parameter as determined by an embodiment of the invention, wherein the optimized value of the operational parameter is represented as a first vector having the individual operational parameters as a basis; b) obtaining a variation across the operational parameters of the substrate to substrate variation of measurement data; c) determining a new value of the operational parameter associated with an expected minimum substrate to substrate variation of the measurement data, wherein the new value of the operational parameter is represented as a second vector having the individual operational parameters as a basis; and d) determining the condition of the semiconductor manufacturing process based on comparison of the first and the second vector.

In an embodiment the following steps are followed: a) measurement data for a plurality of substrates and a plurality of operational parameters is obtained, b) a set of vectors representing the linear combinations of operational parameters present within the measurement data is determined, c) optionally: if a previously determined optimal set of weights for the operational parameters is available then a projection of the set of vectors unto the space defined by the previously determined set of optimal weights is subtracted from the set of vectors, d) a Singular Value Decomposition (SVD) is applied to the set of vectors, e) singular values obtained by the previous step are analyzed; the vectors associated with (near) zero singular values are of particular interest as they represent combinations of operational parameters which do not contain information on the mark deformation, f) based on the vectors associated with the (near) zero singular values a so-called "zero kernel" is calculated; the zero kernel is basically a linear vector space representing combinations of operational parameters which are not affected by an initial mark deformation and/or initial stack (optical) properties.

In an embodiment the singular values are ranked and all singular values exceeding a threshold are filtered out. The zero kernel is determined based on vectors associated with the singular values which are not filtered out.

Changes in processing conditions may be picked up by projection of newly determined operational parameter data (associated with one or more substrates) on the determined zero kernel. In case the nature of mark deformation and/or stack properties changes, the projection of the new operational parameter data to the zero kernel changes and hence the zero kernel may be used in a method to monitor and/or determine changes in processing conditions.

In an embodiment an initial set of vectors representing variation in measurement data and/or performance data is determined for a plurality of operational parameters. The vectors represent linear combinations of operational parameters associated with a reduced substrate to substrate variation of a measurement and/or quality parameter. The procedure of determination of the set of vectors is repeated for a plurality of different mark deformations and/or stack properties. The total set of vectors hence describing optimally chosen operational parameter (combinations) for a standard set of mark deformations and/or stack characteristics. Periodically new measurement data is obtained for new substrates and for multiple operational parameters. The newly obtained measurement data is used to obtain a new vector representation associated with a new optimal operational parameter. The newly obtained vector representation is projected unto the initial set of vectors and the relative weights associated with the projection unto each vector out of the set of vectors are calculated. Subsequently the relative weights are ranked and relative weights below a threshold are considered to be zero (eg components below a certain measure of relevance are filtered out). In an embodiment the optimal operational parameter is monitored and its vector representation is decomposed into vectors belonging to the initial set of vectors. The ranking of the components and application of the threshold is performed subsequently. The relative strengths of the non-zero components may be considered a KPI of the semiconductor manufacturing process, as it can be inferred from these components (vectors) how the etched marks are affected (eg top tilt, sidewall angle change, etc.), which in return may indicate what process steps have changed. For example a large change in relevance of the vector <1,−1> may indicate that a top tilt property of an alignment mark has changed, which is typically associated with a drift of a CMP process step.

In some embodiments, so-called processing aware alignment optimization simulation can be used to provide computational assistance in estimating an optimal color weighted recipe. The simulation based estimation of OCW depends on the quality of input. In an actual processing situation where a process stack is sequentially built up on the substrate, the process stack information (which is needed for Alignment simulations) can change in time resulting in a pre-calculated OCW recipe becoming less optimal. However, if the simulation can be extended with actual monitoring data of process stack parameters, then the simulation can update the OCW recipe along with any unintended or intended changes to the process stack.

In some embodiments, a mechanism is provided to actively monitor parameters that are key performance indicators (KPIs). KPIs are based on alignment data and might typically include data on the alignment shift per wafer. The Alignment simulation can then be used to simulate KPI drift so as to attribute this to stack changes over time. This derived stack information based on KPI monitoring can then be used to derive a correction to the OCW recipe to be fed back to the scanner to improve stability, alignment and overlay performance. This functionality can also be used as a stand-alone quality control tool for monitoring stack parameters or performing root cause analysis of alignment and overlay performance. This information can then be used as a way of determining when to check certain process tools or to flag certain lots and wafers for potential overlay problems.

Figure 7:
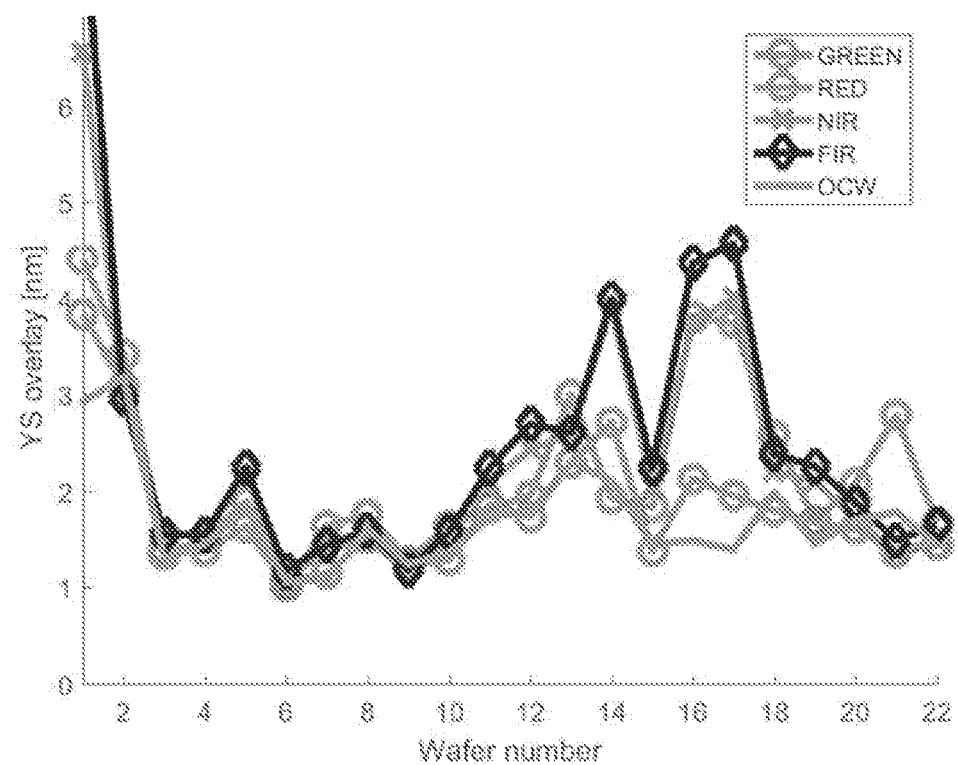
FIG. 7 is a graph showing overlay measurements for a series of wafers subjected to CMP processing.

By way of an example, a wafer processing excursion is illustrated in FIG. 7. This shows overlay measurements of a specific marker made using four different colors (green, red, near infra-red and far infra-red as well as an OCW measurement) for a series of wafers using different CMP process recipes. A set of 5 wafers were processed and this was then repeated (say 1 week later) using the same recipes for another 5 wafers, and again for another 5, and so on. then effect on overlay from wafer alignment was modeled. It can be seen that different alignment recipes have different effects on final performance. Also it can be seen that performance using OCW is more stable than use of any other wavelength for alignment. FIG. 7 also shows that at certain wafer numbers (such as 14 and 16) the process stack changed due to an excursion. This change in the process stack can be modeled via simulation to determine a likely cause of the excursion. A decision can be made whether to: 1. update the process recipe or 2. to flag the wafer as a possible reject, or 3. to leave the recipe unchanged if performance is acceptable.

One application embodying the above principles is in correcting for so-called mark-to-device offset (MTD). This is an effect where an alignment mark has a different shift to nominal than the surrounding product features. The effect is caused by the presence of product features having a significantly smaller pitch (i.e. feature width or spacing between features) than the alignment mark, and therefore exposure light travels through a different part of the projection lens. In case of lens aberrations, for example caused by lens heating, this results in a pitch dependent shift. Since these effects depend on the history of illumination settings and product features on a particular scanner, they are not stable from wafer to wafer or lot to lot, and therefore cannot be fully corrected by APC systems.

Solutions that have been proposed for this problem include: mark design, and computational MTD (c-MTD) determination. Mark design is limited by design rules, detectability, and aberration sensitivity, while cMTD does not take into account the processing impact.

Another method involves the use of sub-segmented marks. Here additional marks are included on the substrate, which have a finer pitch (similar to the pitch of the product features). These so-called sub-segmented marks consist of coarse pitch marks (used for alignment) and fine pitch (to comply with product design rule). Exposure light for illuminating the fine pitched marks passes through the same part of the projection lens as the exposure light for the product features. The pitch dependent shift, or MTD, which is caused by lens aberration results in litho-induced mark asymmetry. This mark asymmetry leads to the differences in aligned positions for different colors of the alignment sensor.

The OCW principles can be applied to the sub-segmented marks to determine weightings for each of the different colors (operational parameters) for the sub-segmented marks, but in this case allowance can also be made for the effect of lens aberration for each of the different colors. The training data used to determine the color weightings is taken from the product overlay data.

Note that in general OCW is applied to minimize the impact of process-induced mark asymmetry, and is particularly appropriate for the layers where processing issues are expected (mainly back-end optical lithography—BEOL). However, MTD is mainly a problem with front-end optical lithography—FEOL, where extreme illumination settings are used.

Figures 8A, 8B, 8C:
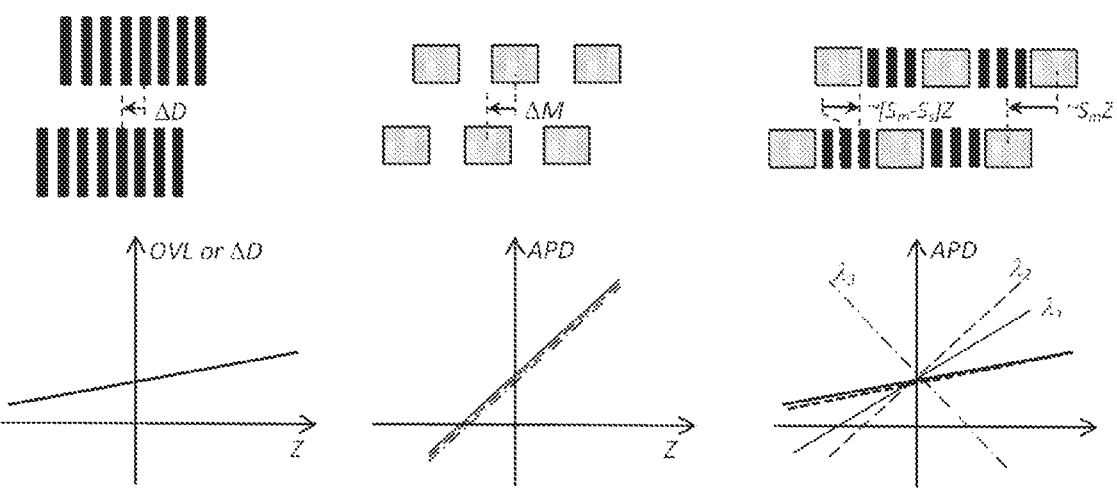
FIGS. 8a-c are graphs showing how product and mark shifts vary for different colours of radiation.

FIG. 8 illustrates the MTD shift effect in three scenarios. In FIG. 8a the effect of lens aberration Z on the sensed overlay error (OVL) for the smaller pitch of the device (product) features is shown as ΔD, which is essentially linearly proportional to the lens aberration Z, such that ΔD=m1+SdZ, where m1 is a constant off-set and Sd a device aberration sensitivity. In FIG. 8b, the larger pitch alignment markers show a shift AM in detected marker position (APD), which is again essentially linear and proportional to Z and is independent of the illuminating radiation (color) such that there is no litho-induced color asymmetry. In this case ΔM=m2+SmZ where m2 is a constant off-set and Sm a main marker aberration sensitivity. AM does not have the same relationship (i.e. gradient of the graph) as ΔD because the illuminating radiation is passing through a different part of the projection lens.

In FIG. 8c the effect is shown for sub-segmented marks. Here there is a color (wavelength) dependence, which gives rise to a litho-induced asymmetry (different measurements for different colors). Here ΔM=m3+SmZ+K(λ)[Sm−Ss]Z where Ss is a segmented mark sensitivity and K(λ) a stack sensitivity. However, by use of the principles of OCW, as discussed above, with different weightings applied to different colors, it is possible to determine a color-weighted measurement that is very close to the actual overlay error, and which takes account of the lens aberration effect that causes the MTD shift.

Figure 9:
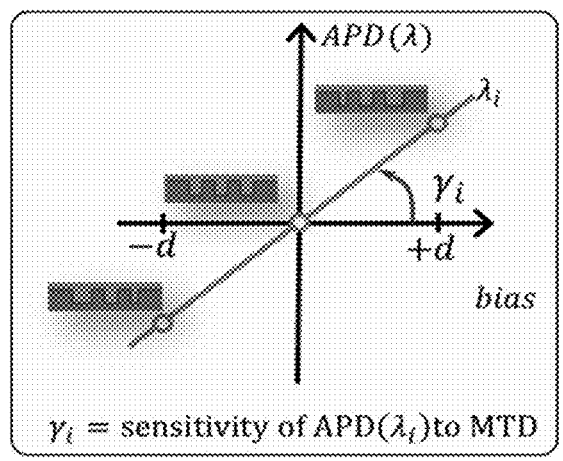
FIG. 9 is a graph showing how a sensitivity to mark-to device shift can be calibrated.

In order to calibrate the color weights to be insensitive to MTD, the calibration set may include a lens heating effect. It is also possible to obtain calibration data from measurements made using designer segmented marks (DSM) where marks with intentional MTD shifts are used to calculate for each color the sensitivity of alignment position to MTD. An example calibration is shown graphically in FIG. 9. Another possibility is to calculate the sensitivity of different colors using computational methods.

The same principles can also be applied for metrology marks used to measure overlay, since also these marks can be sub-segmented and will suffer from similar mark to device offsets.

Another problem that can be addressed by the OCW principles described herein concerns variations that can occur across a substrate or wafer. Hitherto wafer alignment settings, such as mark layout, color(s) and mark type, are used for an entire wafer. Mark asymmetry, however, typically varies across the wafer in different regions. Using the same color settings for wafer alignment of the entire wafer does not take account of the varied mark asymmetry, and this can lead to further wafer-to-wafer variation. For example, in situations where wafer edge mark asymmetry is large, current practice is to ignore marks at the wafer edge if these give rise to unacceptably large errors.

Accordingly, embodiments can provide for the optimization by use of OCW for wafer alignment to be applied across the wafer surface area by applying different color weightings to different areas or zones of the wafer. Thus, the different color weightings enable a reduction in overlay error in the areas where the mark asymmetry is larger or different than the rest of the wafer. Moreover, when correct color weighting is applied per region/zone (i.e. edge vs center), there is more flexibility for wafer alignment layout optimization.

Figure 10:
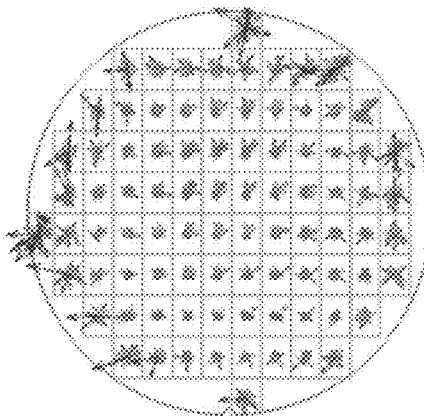
FIG. 10 is a plot showing alignment mark asymmetry across a wafer.
Figures 11A, 11B, 11C:
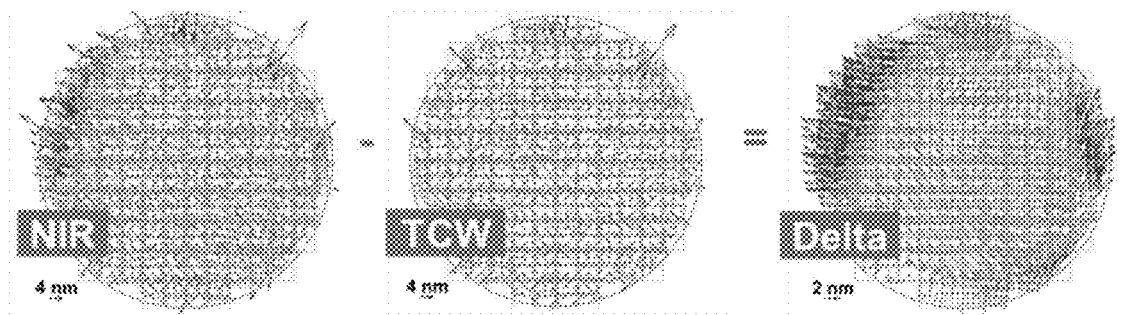
FIG. 11a is a plot showing an on-product overlay for a wafer map where the active color is near-infrared (NIR).
FIG. 11b shows an on-product overlay wafer map for the same wafer using a two-color weighting.
FIG. 11c shows the differences between the plots of FIGS. 11a and 11b.

FIG. 10 shows an alignment mark asymmetry plot across a wafer. The plot shows the variation between four colors for an array of alignment marks over the wafer. The larger the arrows associated with a mark the greater the degree of mark asymmetry. Mark asymmetry is clearly bigger on the edge of the wafer. A similar effect can be seen in FIG. 11, in which the plot of FIG. 11a shows an on-product overlay wafer map where the active color is near-infrared (NIR). The plot of FIG. 11b shows an on-product overlay wafer map for the same wafer using a two-color weighting. The plot of FIG. 11c shows the differences between the plots of FIGS. 11a and 11b, and it is clear that there is a significant difference between NIR and TCW. The difference is most significant in the areas distributed around the edge of the wafer. This demonstrates that the impact of the mark asymmetry varies across the wafer. In order to investigate this behaviour a TCW analysis was performed for the edge of the wafer and for the center of the wafer to determine the best color weighting for both zones on the wafer.

The improvement in wafer alignment performance can be shown with reference to just two colors and applying two color weighting (TCW). FIG. 12 contains two graphs, one for a mark at the edge of the wafer and the other for a mark at the center. Each graph shows how the overlay errors vary for two orthogonal directions parallel to the wafer surface (X-overlay and Y-overlay) as a function of different two-color weighting combinations. The two colors in this case are green (i.e. visible light at around 510 nm) and near infra-red (NIR). The two-color weightings are from −1 to 2 for green and from 2 to −1 for NIR. The total of the weights is always 1.

FIG. 12 shows that the optimal color weighting (where the overlay error is at a minimum) is different for the edge and for the center of the wafer. For the edge of the wafer the combination of green with −1 and NIR with 2 weighting gives the best performance, while for the center of the wafer green with −0.4 and NIR with 1.4 weighting gives the best performance. The difference between the weightings is 20%.

It will be appreciated that a greater improvement could be realized with use of more colors/color weightings.

Applying color weighting to different zones of the wafer (ultimately per mark) reduces the impact of mark asymmetry at the edge of the wafer as well as in the center. There are different color settings (color, weighting) for each zone of the wafer where this method can be applied. In this way, the user can optimize the wafer alignment strategy for different zones of the wafer and fine tune for the wafer alignment to reduce the wafer-to-wafer variation during their process.

In the wafer processing methods described above, two sets of overlay corrections are applied that have an impact on overlay wafer-to-wafer variation. One correction is from alignment. Before a wafer is exposed, alignment marks on that wafer are measured by the scanner alignment sensor, and a correction set is calculated on the alignment measurement using a pre-defined alignment model. During the exposure, the correction is then applied to that wafer. The other correction is per wafer overlay process correction. After exposure of a wafer, it is sent to the overlay metrology tool to measure overlay marks. The measured overlay is used to calculate a correction set, which is used for setting the ensuing exposures. This correction can be done per wafer.

The two correction methods each have pros and cons. Alignment is always done per wafer and is a real time correction, but the number of alignment marks is limited due to limited measurement time and it can be adversely affected by alignment mark asymmetry. Overlay per wafer correction has more correction capacity—many overlay marks per wafer can be measured—but the correction is not normally 'real-time': e.g. a time filter is used in run-to-run control.

Alignment and per wafer overlay correction have the same goal, which is to reduce overlay wafer-to-wafer variation. The setup of two methods are done separately: for alignment correction the set-up is based on optimizing the alignment model, sampling and color; whereas for overlay correction the set-up is based on optimizing the overlay model, sampling, measurement frequency, etc. However, the independent setups do not take account of the interaction between alignment and overlay. Thus the settings can be sub-optimal.

This point is illustrated schematically in FIG. 13. The top diagram shows the process for determining an OCW for the alignment correction, using multiple different colours, models and layouts. The overlay measurements are used to evaluate an optimal combination of colour, model and layout, and, as described above, an optimal colour weighting is determined for the alignment correction process. The bottom diagram shows the corresponding process for the overlay correction, using multiple frequencies, models and layouts. The overlay measurements are used to evaluate an optimal combination of frequency, model and layout, and again an optimal colour weighting is determined for the alignment correction process. Note that the optimal colour weightings will be different for the two correction procedures.

Figure 14:
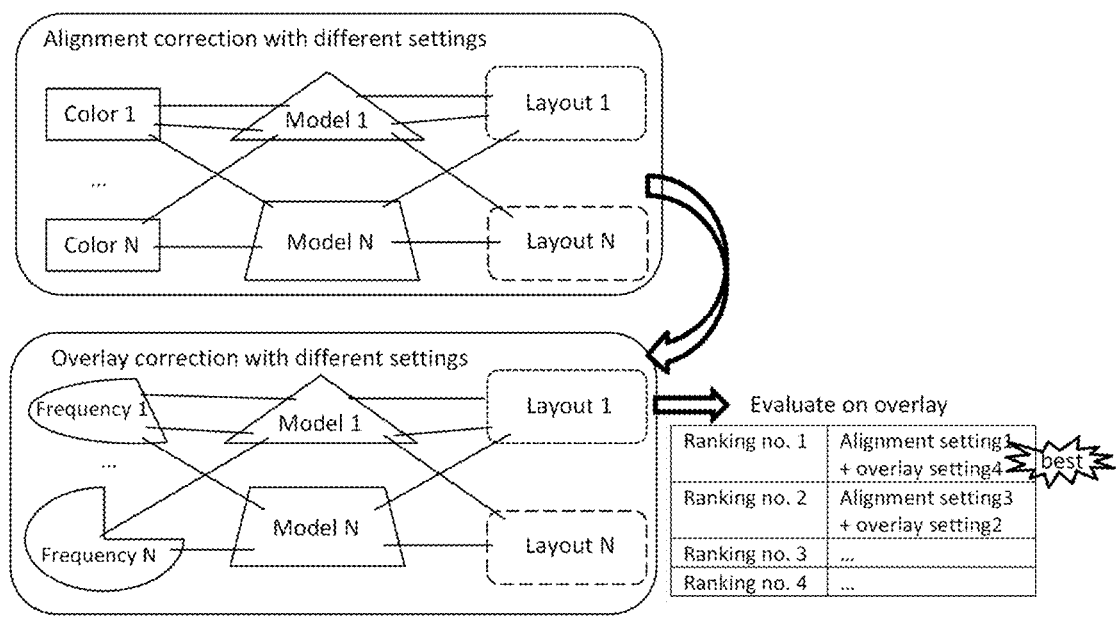
FIG. 14 schematically shows a process for determining an optimal combination for both an alignment correction and an overlay correction.

In embodiments of the invention, as shown in FIG. 14, the evaluation of the overlay is used to provide a single evaluation to determine an optimal combination for both the alignment correction and the overlay correction. Thus, by simultaneously evaluating the settings based on the same overlay measurements, a single combination of alignment setting parameters and overlay setting parameters is determined, which are optimal for the combination of the alignment and overlay corrections, but may turn out to be different to either of the settings determined for just one or the other of the alignment and overlay corrections.

The described method of Optimal Color Weighting (OCW) is a very effective method to minimize the impact of processing artefacts (affecting marks for example) on the control of a lithographic apparatus. However not in all cases it is needed to utilize the OCW method. It could be that: a) the processing induced wafer to wafer quality parameter (for example overlay) variation is small or not correctable; the processing induced variation will then not be present in the end result and/or b) the mark is robust enough to processing artefacts and reading the mark (or stack in case of a level sensor readout) for any chosen operational parameter will give similar results. Evaluation of the merits of OCW may need to be done for each layer on a substrate subject to the semiconductor manufacturing process. In an embodiment for a set of layers of interest both the i) wafer to wafer variation of a correctable associated with a quality parameter and ii) wafer to wafer variation of the variation in the measurement data across the operational parameters is determined. Layers for which the wafer to wafer variation of the correctable and/or the wafer to wafer variation of the measurement data variation is below a certain threshold may be excluded from the OCW framework.

In an embodiment a layer associated with a substrate is selected based on evaluation of: a) a first substrate to substrate variation of a quality parameter associated with the layer and b) a second substrate to substrate variation of a variation between measurement parameters associated with the layer across a selection of operational parameters.

In an embodiment the layer is selected for application of the OCW algorithm in case the first substrate to substrate variation and the second substrate to substrate variation exceed a threshold.

In an embodiment the first substrate to substrate variation and the second substrate to substrate variation are configured as KPI's of the semiconductor process. These KPI's are monitored in time by for example plotting them in one plot (the x-axis being a value of the first KPI associated with the first substrate to substrate variation and the y-axis being a value of the second KPI associated with the second substrate to substrate variation).

In case both the first and the second KPI exceed a threshold it may be decided to determine a new OCW recipe by re-calculating the optimal operational parameter configured to yield a minimum substrate to substrate variation of the quality parameter. As the variation of the quality parameter and the variability of the measurement data across the operational parameters are coupled it may be concluded that a) the measurements are clearly affected by a change in processing and b) that performance (represented by the quality parameter) is suffering as a result. Hence re-calculation of the optimum operational parameter will probably improve the performance (eg. decrease the first substrate tot substrate variation) and hence makes sense.

Alternatively both the first and second KPI may be lumped into a single KPI. In this case it may be decided to determine a new OCW recipe when the single KPI exceeds a threshold.

In case only the second KPI exceeds a threshold it is likely that the marks are affected by a change in processing, but this does not lead to a pronounced worsening of performance. It may be concluded that current OCW settings (recipe comprising an optimal operational parameter setting) are adequate for the control of the changed processing.

In case only the first KPI exceed a threshold it is likely that process induced mark deformation and/or stack characteristic changes are not responsible for the observed change of the quality parameter variability. It makes hence less sense to re-calculate the optimal operational parameter(s).

Further embodiments of the invention are disclosed in the list of numbered clauses below:

1. A method for determining one or more optimized values of an operational parameter of a sensor system configured for measuring a property of a substrate, the method comprising:
   determining a quality parameter for a plurality of substrates;
   determining measurement parameters for the plurality of substrates obtained using the sensor system for a plurality of values of the operational parameter;
   comparing a substrate to substrate variation of the quality parameter and a substrate to substrate variation of a mapping of the measurement parameters; and
   determining the one or more optimized values of the operational parameter based on the comparing.

2. The method of clause 1, wherein the mapping is a weighted sum, a non-linear mapping or a trained mapping based on machine learning methods.

3. The method of clause 1 further comprising a step of determining an optimal set of weight factors for weighting the measurement parameter associated with a first value of the operational parameter and the measurement parameter associated with a second value of the operational parameter based on the comparing.

4. The method of any preceding clause, wherein the quality parameter is an overlay or focus parameter.

5. The method of any preceding clause, wherein the measurement parameter is a position of a feature provided to the plurality of substrates or an out-of-plane deviation of a location on the substrate.

6. The method of any preceding clause, wherein the operational parameter is a parameter associated with a light source from the sensor system.

7. The method of clause 5, wherein the operational parameter is a wavelength, polarization state, spatial coherence state or temporal coherence state of the light source.

8. The method of any preceding clause, wherein the quality parameter is determined using a metrology system.

9. The method of any of clauses 1-6, wherein the quality parameter is determined using a simulation model predicting the quality parameter based on any of: context information, measurement data, reconstructed data, hybrid metrology data.

10. A method for determining a condition of a semiconductor manufacturing process, the method comprising:
determining the optimized value of the operational parameter according to any preceding clause;
comparing the determined operational parameter to a reference operational parameter; and
determining the condition based on the comparison.

11. A method of optimising measurement data from a sensor system configured for measuring a property of a substrate, the method comprising:
obtaining overlay data for a plurality of substrates, wherein the overlay represents a deviation between a measured and an expected position of an alignment marker on a substrate and comprises a plurality of measurements of the alignment marker position made by a sensor system, each of the plurality of measurements utilising a different operational parameter of the sensor system;
based on the obtained overlay data, and for each of the different operational parameters, determining a weight for adjusting the measurements obtained utilising the operational parameter such that the weighted adjustments to the measurements made by the sensor system for all of the different operational parameters are combined to minimise the overlay.

12. The method of clause 11, wherein the operational parameter is a parameter associated with a radiation source from the sensor system.

13. The method of clause 12, wherein the operational parameter is a wavelength, polarization state, spatial coherence state or temporal coherence state of the light source.

14. The method of any of clauses 1 to 9, further comprising determining a characteristic of a stack applied to the substrate based on comparing the determined measurement parameters to modelled measurement parameters, wherein the model has the characteristic as an input.

15. The method of clause 14, further comprising updating the optimized values of the operational parameters based on the characteristic.

16. The method of clause 15, wherein the updating is further based on an expected substrate to substrate variation of the quality parameter associated with using the updated optimized values of the operational parameters.

17. The method of any of clauses 14 to 16, wherein the measurement parameter is a measured position of an alignment mark and the quality parameter is an overlay error.

18. The method of any of clauses 14 to 17, further comprising determining a possible cause of a process excursion based on the determined characteristic of the stack.

19. The method of clause 18, wherein the stack is applied in accordance with a processing recipe, the method further comprising making a determination based on the simulation to change the recipe.

20. The method of any of clauses 1 to 9 wherein determining the one or more optimized values of the operational parameter based on the comparing is performed for different zones of the substrate.

21. The method of clause 20 wherein the different zones comprise a zone proximate an edge of the substrate and a zone proximate a centre of the substrate.

22. The method of clause 20 or clause 21 wherein each zone comprises one or more alignment marks applied to the substrate.

23. The method of clause 20 or clause 21 wherein each zone corresponds to an individual alignment mark of a plurality of alignment marks applied to the substrate.

24. The method of any of clauses 1 to 9, wherein the measurement parameter is a measured position of a mark and the quality parameter is a mark-to-device shift, the optimized values of the operational parameter being determined so as to optimize the quality parameter such that a substrate to substrate variation is minimal.

25. The method of clause 24 wherein the operational parameters are parameters associated with a radiation source, radiation from the source being directed at the substrate, and the optimized value of the operational parameter is determined by applying a weighting for adjusting the measurements obtained utilising the operational parameter.

26. The method of clause 25 wherein the radiation from the source directed at the substrate is collected by a sensor system after targeting the substrate.

27. The method of clause 25 wherein the weighting includes a lens heating effect of a lens used for directing radiation at the substrate and/or for collecting radiation by the sensor system.

28. The method of any of clauses 24 to 27 further comprising determining the weightings for the operational parameters for measuring sub-segmented marks using measurements obtained from substrates having sub-segmented marks that have intentional mark-to-device shifts applied thereto so as to determine a sensitivity of the operational parameter to mark-to-device shifts.

29. The method of any of clauses 1 to 9, for optimizing operational parameters of metrology systems utilized to control processing of substrates, wherein the sensor system comprises a first sensor system associated with a first measurement system configured to measure a first characteristic of a substrate before processing and a second sensor system associated with a second measurement system configured to measure a second characteristic of the substrate after processing, wherein the method comprises:
determining a first set of the measurement parameters for the plurality of substrates obtained using the first sensor system for the plurality of values of the operational parameter;
determining a second set of the measurement parameters for the plurality of substrates obtained using the second sensor system for the plurality of values of the operational parameter;
comparing a substrate to substrate variation of the quality parameter and a substrate to substrate variation of a mapping of the measurement parameters for each of the first and second sets of measurement parameters; and
wherein the determining of one or more optimized values of the operational parameters comprises optimizing a first set of operational parameters associated with the first measurement system and a second set of operational parameters associated with the second measurement system simultaneously, wherein the optimizing mitigates a substrate to substrate variation of the second characteristic.

30. The method of clause 29 wherein the quality parameter is an overlay determined from the measured second characteristic of the substrate after processing.

31. The method of clause 1, wherein the quality parameter and the measurement parameter are associated with a particular layer associated with the plurality of substrates.

32. The method of clause 31, wherein the particular layer is selected based on evaluation of: i) a first substrate to substrate variation of the quality parameter associated with the particular layer and ii) a second substrate to substrate variation of the variation between the measurement parameters associated with the particular layer.

33. The method of clause 32, wherein the particular layer is selected in case the first substrate to substrate variation and the second substrate to substrate variation exceed a threshold.

34. A method for monitoring the condition of a semiconductor manufacturing process, the method comprising:
  a. obtaining an optimized value of the operational parameter using the method of any of clauses 1 to 28;
  b. obtaining measurement parameters for a further substrate obtained using the sensor system for a plurality of values of the operational parameter;
  c. determining a new value of the operational parameter associated with an expected minimum substrate to substrate variation of the measurement data; and
  d. determining the condition of the semiconductor manufacturing process based on comparison of the optimized value and the new value of the operational parameter.

35. The method according to clause 1, wherein the optimized values of the operational parameter comprise a set of first values associated with a first coordinate of the measurement parameters and a set of second values associated with a second coordinate of the measurement parameters.

36. The method according to clause 35, further comprising:
  determining a third coordinate parallel to a first preferential direction of a mark;
  determining a fourth coordinate parallel to a second preferential direction of a mark;
  determining a set of third optimized values of the operational parameter associated with the third coordinate and a set of fourth optimized values of the operational parameter associated with the fourth coordinate;
  determining a transformation from the third and fourth coordinates to the first and second coordinates; and
  transforming the determined optimized values of the operational parameters in the third and fourth coordinates to optimised values of the operational parameters in the first and second coordinates, using the determined transformation.

37. The method according to clause 35, wherein the first values of the operational parameter are optimised independently of the second values of the operational parameter.

Figure 16:
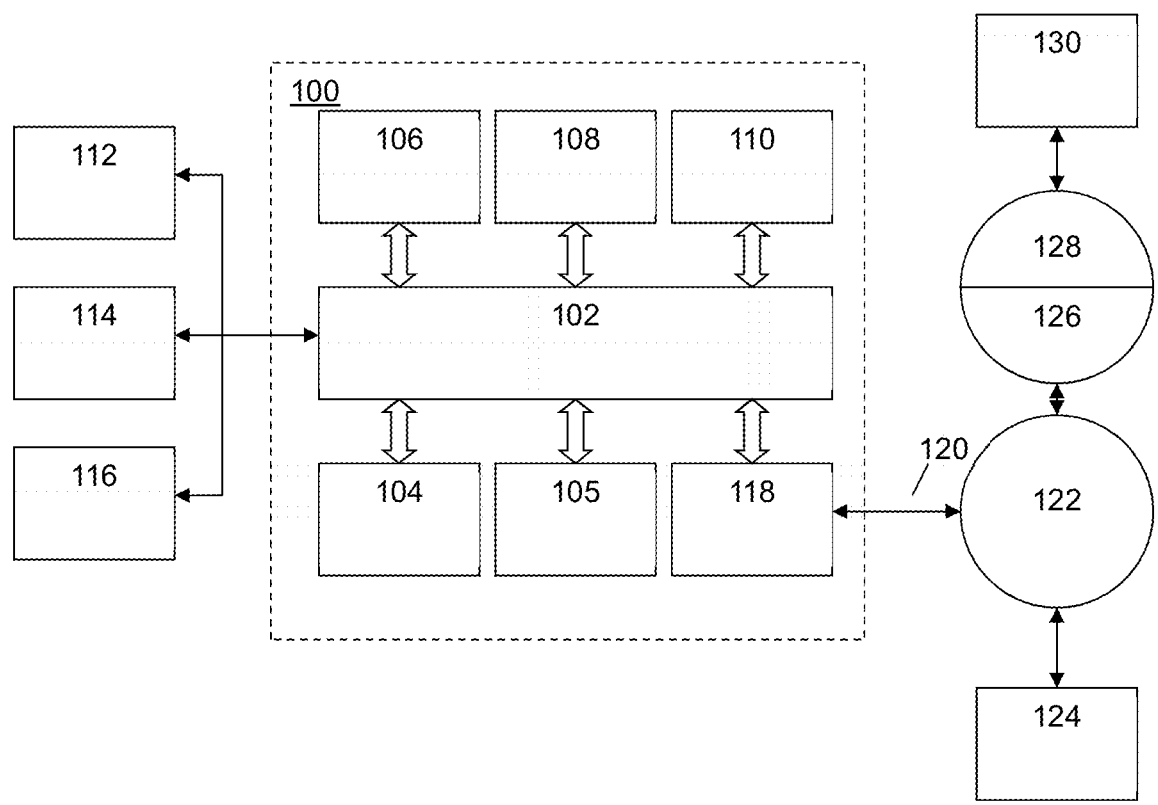
FIG. 16 is a block diagram illustrating a computer system which may be used in utilizing the embodiments described in this document.

FIG. 16 is a block diagram that illustrates a computer system 100 which can assist in implementing methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions.

The instructions received by main memory 106 may optionally be stored on storage device 110 either before or after execution by processor 104.

Computer system 100 also desirably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are example forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The reader should appreciate that the present application describes several inventions. Rather than separating those inventions into multiple isolated patent applications, applicants have grouped these inventions into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary sections of the present document should be taken as containing a comprehensive listing of all such inventions or all aspects of such inventions.

It should be understood that the description and the drawings are not intended to limit the invention to the particular form disclosed, but to the contrary, the intention is to cover all modifications, equivalents, and alternatives falling within the spirit and scope of the present invention as defined by the appended claims.

Modifications and alternative embodiments of various aspects of the invention will be apparent to those skilled in the art in view of this description. Accordingly, this description and the drawings are to be construed as illustrative only and are for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed, change in order or omitted, certain features may be utilized independently, and embodiments or features of embodiments may be combined, all as would be apparent to one skilled in the art after having the benefit of this description of the invention. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise.

Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every.

To the extent certain U.S. patents, U.S. patent applications, or other materials (e.g., articles) have been incorporated by reference, the text of such U.S. patents, U.S. patent applications, and other materials is only incorporated by reference to the extent that no conflict exists between such material and the statements and drawings set forth herein. In the event of such conflict, any such conflicting text in such incorporated by reference U.S. patents, U.S. patent applications, and other materials is specifically not incorporated by reference herein.

While specific embodiments of the disclosure have been described above, it will be appreciated that the embodiments may be practiced otherwise than as described.

The invention claimed is:

1. A method comprising:
   obtaining measurement parameter values for a plurality of substrates, wherein the measurement parameter values are obtained, using a sensor system, for a plurality of values of an operational parameter corresponding to a physical characteristic of radiation in the sensor system;
   comparing, by a hardware computer system, a substrate to substrate variation of a quality parameter for the plurality of substrates and a substrate to substrate variation of a mapping of the measurement parameter values; and
   determining, based on the comparing, one or more optimized values of the operational parameter.

2. The method of claim 1, further comprising determining, based on the comparing, a set of weight factors for weighting the measurement parameter values associated with a first value of the operational parameter and the measurement parameter values associated with a second value of the operational parameter.

3. The method of claim 1, wherein the quality parameter is an overlay or focus parameter.

4. The method of claim 1, wherein the measurement parameter is a position of a feature provided to one or more substrates of the plurality of substrates or an out-of-plane deviation of a location on one or more substrates of the plurality of substrates.

5. The method of claim 1, wherein the operational parameter is a wavelength, polarization state, spatial coherence state or temporal coherence state of the radiation.

6. The method of claim 1, wherein the quality parameter is determined using a metrology system.

7. The method of claim 1, wherein the quality parameter is determined using a simulation model predicting the quality parameter based on any one or more selected from: context information, measurement data, reconstructed data, and/or hybrid metrology data.

8. The method of claim 1, wherein the determining one or more optimized values of the operational parameter is performed for different zones of the substrate.

9. The method of claim 1, wherein the measurement parameter is a measured position of a mark, the quality parameter is a mark-to-device shift, and the one or more optimized values of the operational parameter are determined so as to optimize the quality parameter such that a substrate to substrate variation is reduced or minimal.

10. The method of claim 1, wherein the operational parameter is a parameter associated with a radiation source from which radiation is directed at the substrate, and the one or more optimized values of the operational parameter are determined by applying a weighting for adjusting measurements obtained utilizing the operational parameter.

11. The method of claim 1, further comprising determining weightings for the operational parameter for measuring sub-segmented marks using measurements obtained from substrates having sub-segmented marks that have intentional mark-to-device shifts applied thereto so as to determine a sensitivity of the operational parameter to mark-to-device shifts.

12. The method of claim 1, wherein the quality parameter and the measurement parameter are associated with a particular layer associated with the plurality of substrates.

13. The method of claim 12, wherein the particular layer is selected based on evaluation of:
   a first substrate to substrate variation of the quality parameter associated with the particular layer; and a second substrate to substrate variation of the variation between the measurement parameter values associated with the particular layer.

14. The method of claim 13, wherein the particular layer is selected responsive to the first substrate to substrate variation and the second substrate to substrate variation exceeding a threshold.

15. The method of claim 1, wherein the one or more optimized values of the operational parameter comprise a set of one or more first values associated with a first coordinate of the measurement parameter values and a set of one or more second values associated with a second coordinate of the measurement parameter values.

16. The method of claim 15, further comprising:
  determining a third coordinate parallel to a first preferential direction of a mark;
  determining a fourth coordinate parallel to a second preferential direction of a mark;
  determining a set of one or more third optimized values of the operational parameter associated with the third coordinate and a set of one or more fourth optimized values of the operational parameter associated with the fourth coordinate; and
  transforming, using a transformation from the third and fourth coordinates to the first and second coordinates, the determined optimized values of the operational parameter in the third and fourth coordinates to optimized values of the operational parameter in the first and second coordinates.

17. The method of claim 15, wherein the one or more first values are optimized independently of the one or more second values.

18. A method for monitoring the condition of a semiconductor manufacturing process, the method comprising:
  obtaining an optimized value of the operational parameter using the method of claim 1;
  obtaining measurement parameter values for a further substrate, obtained using the sensor system, for a plurality of values of the operational parameter;
  determining a new value of the operational parameter associated with an expected minimum substrate to substrate variation of the measurement data; and
  determining the condition of the semiconductor manufacturing process based on comparison of the optimized value and the new value of the operational parameter.

19. A non-transitory computer program product comprising program instructions therein that, when executed by a suitable apparatus, are configured to cause the apparatus to at least:
  obtain measurement parameter values for a plurality of substrates, wherein the measurement parameter values are obtained, using a sensor system, for a plurality of values of an operational parameter corresponding to a physical characteristic of radiation in the sensor system;
  compare a substrate to substrate variation of a quality parameter for the plurality of substrates and a substrate to substrate variation of a mapping of the measurement parameter values; and
  determine, based on the comparing, one or more optimized values of the operational parameter.

20. The computer program product of claim 19, wherein the instructions are further configured to cause the apparatus to determine, based on the comparison, a set of weight factors for weighting the measurement parameter values associated with a first value of the operational parameter and the measurement parameter values associated with a second value of the operational parameter.

* * * * *